United States Patent
Weeks

(10) Patent No.: US 9,324,811 B2
(45) Date of Patent: Apr. 26, 2016

(54) STRUCTURES AND DEVICES INCLUDING A TENSILE-STRESSED SILICON ARSENIC LAYER AND METHODS OF FORMING SAME

(71) Applicant: ASM IP Holding B.V., Almere (NL)

(72) Inventor: Keith Doran Weeks, Chandler, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/018,345

(22) Filed: Sep. 4, 2013

(65) Prior Publication Data

US 2014/0084341 A1 Mar. 27, 2014

Related U.S. Application Data

(60) Provisional application No. 61/705,932, filed on Sep. 26, 2012.

(51) Int. Cl.
| | |
|---|---|
| *H01L 21/336* | (2006.01) |
| *H01L 29/267* | (2006.01) |
| *H01L 21/02* | (2006.01) |
| *H01L 29/10* | (2006.01) |
| *H01L 21/67* | (2006.01) |

(52) U.S. Cl.
CPC .......... *H01L 29/267* (2013.01); *H01L 21/0262* (2013.01); *H01L 21/02521* (2013.01); *H01L 21/02532* (2013.01); *H01L 21/02576* (2013.01); *H01L 29/1054* (2013.01); *H01L 21/67207* (2013.01)

(58) Field of Classification Search
CPC ............ H01L 29/267; H01L 21/02532; H01L 21/02521; H01L 29/1054; H01L 29/7843; H01L 21/823807; H01L 21/823864; H01L 21/67207; H01L 21/0251

USPC ........... 438/478, 50, 218, 301, 658, 210, 300; 257/190

See application file for complete search history.

(56) References Cited

U.S. PATENT DOCUMENTS

| | | | |
|---|---|---|---|
| D56,051 S | 8/1920 | Cohn | |
| 2,161,626 A | 6/1939 | Loughner et al. | |
| 2,745,640 A | 5/1956 | Cushman | |
| 2,990,045 A | 9/1959 | Root | |
| 3,089,507 A | 5/1963 | Drake et al. | |
| 3,833,492 A | 9/1974 | Bollyky | |

(Continued)

FOREIGN PATENT DOCUMENTS

| | | |
|---|---|---|
| CN | 1563483 | 1/2005 |
| CN | 101330015 | 12/2008 |

(Continued)

OTHER PUBLICATIONS

USPTO; Office Action dated Aug. 27, 2010 in U.S. Appl. No. 12/118,596.

(Continued)

*Primary Examiner* — Yosef Gebreyesus
(74) *Attorney, Agent, or Firm* — Snell & Wilmer LLP

(57) ABSTRACT

Structures including a tensile-stressed silicon arsenic layer, devices including the structures, and methods of forming the devices and structures are disclosed. Exemplary tensile-stressed silicon arsenic layer have an arsenic doping level of greater than 5 E+20 arsenic atoms per cubic centimeter. The structures can be used to form metal oxide semiconductor devices.

10 Claims, 9 Drawing Sheets

(56) References Cited

U.S. PATENT DOCUMENTS

| | | | |
|---|---|---|---|
| 3,854,443 A | 12/1974 | Baerg | |
| 3,862,397 A | 1/1975 | Anderson et al. | |
| 3,887,790 A | 6/1975 | Ferguson | |
| 4,054,071 A | 10/1977 | Patejak | |
| 4,058,430 A | 11/1977 | Suntola et al. | |
| 4,134,425 A | 1/1979 | Gussefeld et al. | |
| 4,145,699 A | 3/1979 | Hu et al. | |
| 4,176,630 A | 12/1979 | Elmer | |
| 4,181,330 A | 1/1980 | Kojima | |
| 4,194,536 A | 3/1980 | Stine et al. | |
| 4,322,592 A | 3/1982 | Martin | |
| 4,389,973 A | 6/1983 | Suntola et al. | |
| 4,393,013 A | 7/1983 | McMenamin | |
| 4,401,507 A | 8/1983 | Engle | |
| 4,414,492 A | 11/1983 | Hanlet | |
| 4,436,674 A | 3/1984 | McMenamin | |
| 4,479,831 A * | 10/1984 | Sandow | H01L 21/2022 257/412 |
| 4,499,354 A | 2/1985 | Hill et al. | |
| 4,512,113 A | 4/1985 | Budinger | |
| 4,570,328 A | 2/1986 | Price et al. | |
| 4,579,623 A | 4/1986 | Suzuki et al. | |
| D288,556 S | 3/1987 | Wallgren | |
| 4,653,541 A | 3/1987 | Oehlschlaeger et al. | |
| 4,654,226 A | 3/1987 | Jackson et al. | |
| 4,681,134 A | 7/1987 | Paris | |
| 4,718,637 A | 1/1988 | Contin | |
| 4,722,298 A | 2/1988 | Rubin et al. | |
| 4,735,259 A | 4/1988 | Vincent | |
| 4,753,192 A | 6/1988 | Goldsmith et al. | |
| 4,780,169 A | 10/1988 | Stark et al. | |
| 4,789,294 A | 12/1988 | Sato et al. | |
| 4,821,674 A | 4/1989 | deBoer et al. | |
| 4,827,430 A | 5/1989 | Aid et al. | |
| 4,837,185 A | 6/1989 | Yau et al. | |
| 4,854,263 A | 8/1989 | Chang et al. | |
| 4,857,137 A | 8/1989 | Tashiro et al. | |
| 4,857,382 A | 8/1989 | Sheng et al. | |
| 4,882,199 A | 11/1989 | Sadoway et al. | |
| 4,985,114 A | 1/1991 | Okudaira | |
| 4,986,215 A | 1/1991 | Yamada | |
| 4,987,856 A | 1/1991 | Hey | |
| 4,991,614 A | 2/1991 | Hammel | |
| 5,013,691 A | 5/1991 | Lory et al. | |
| 5,028,366 A | 7/1991 | Harakal et al. | |
| 5,060,322 A | 10/1991 | Delepine | |
| 5,062,386 A | 11/1991 | Christensen | |
| 5,074,017 A | 12/1991 | Toya et al. | |
| 5,098,638 A * | 3/1992 | Sawada | H01L 21/2257 148/DIG. 123 |
| 5,116,018 A | 5/1992 | Friemoth et al. | |
| D327,534 S | 6/1992 | Manville | |
| 5,119,760 A | 6/1992 | McMillan et al. | |
| 5,167,716 A | 12/1992 | Boitnott et al. | |
| 5,178,682 A | 1/1993 | Tsukamoto et al. | |
| 5,183,511 A | 2/1993 | Yamazaki et al. | |
| 5,192,717 A | 3/1993 | Kawakami | |
| 5,194,401 A | 3/1993 | Adams et al. | |
| 5,199,603 A | 4/1993 | Prescott | |
| 5,221,556 A | 6/1993 | Hawkins et al. | |
| 5,242,539 A | 9/1993 | Kumihashi et al. | |
| 5,243,195 A | 9/1993 | Nishi | |
| 5,288,684 A | 2/1994 | Yamazaki et al. | |
| 5,306,946 A | 4/1994 | Yamamoto | |
| 5,326,427 A | 7/1994 | Jerbic | |
| 5,354,580 A | 10/1994 | Goela et al. | |
| 5,356,478 A | 10/1994 | Chen et al. | |
| 5,380,367 A | 1/1995 | Bertone | |
| 5,382,311 A | 1/1995 | Ishikawa et al. | |
| 5,404,082 A | 4/1995 | Hernandez et al. | |
| 5,415,753 A | 5/1995 | Hurwitt et al. | |
| 5,421,893 A | 6/1995 | Perlov | |
| 5,422,139 A | 6/1995 | Fischer | |
| 5,430,011 A | 7/1995 | Tanaka et al. | |
| 5,494,494 A | 2/1996 | Mizuno et al. | |
| 5,496,408 A | 3/1996 | Motoda et al. | |
| 5,504,042 A | 4/1996 | Cho et al. | |
| 5,518,549 A | 5/1996 | Hellwig | |
| 5,527,417 A | 6/1996 | Iida et al. | |
| 5,531,835 A | 7/1996 | Fodor et al. | |
| 5,574,247 A | 11/1996 | Nishitani et al. | |
| 5,589,002 A | 12/1996 | Su | |
| 5,589,110 A | 12/1996 | Motoda et al. | |
| 5,595,606 A | 1/1997 | Fujikawa et al. | |
| 5,601,641 A | 2/1997 | Stephens | |
| 5,604,410 A | 2/1997 | Vollkommer et al. | |
| 5,616,947 A | 4/1997 | Tamura | |
| 5,632,919 A | 5/1997 | MacCracken et al. | |
| D380,527 S | 7/1997 | Velez | |
| 5,679,215 A | 10/1997 | Barnes et al. | |
| 5,681,779 A | 10/1997 | Pasch et al. | |
| 5,683,517 A | 11/1997 | Shan | |
| 5,695,567 A | 12/1997 | Kordina | |
| 5,718,574 A | 2/1998 | Shimazu | |
| 5,728,223 A | 3/1998 | Murakarni et al. | |
| 5,730,801 A | 3/1998 | Tepman | |
| 5,732,744 A | 3/1998 | Barr et al. | |
| 5,736,314 A | 4/1998 | Hayes et al. | |
| 5,781,693 A | 7/1998 | Balance et al. | |
| 5,796,074 A | 8/1998 | Edelstein et al. | |
| 5,801,104 A | 9/1998 | Schuegraf et al. | |
| 5,819,434 A | 10/1998 | Herchen et al. | |
| 5,827,757 A | 10/1998 | Robinson, Jr. et al. | |
| 5,836,483 A | 11/1998 | Disel | |
| 5,837,320 A | 11/1998 | Hampden-Smith et al. | |
| 5,853,484 A | 12/1998 | Jeong | |
| 5,855,680 A | 1/1999 | Soininen et al. | |
| 5,855,681 A | 1/1999 | Maydan et al. | |
| 5,873,942 A | 2/1999 | Park | |
| 5,877,095 A | 3/1999 | Tamura et al. | |
| 5,908,672 A | 6/1999 | Ryu | |
| 5,916,365 A | 6/1999 | Sherman | |
| 5,920,798 A | 7/1999 | Higuchi et al. | |
| 5,968,275 A | 10/1999 | Lee et al. | |
| 5,975,492 A | 11/1999 | Brenes | |
| 5,979,506 A | 11/1999 | Aarseth | |
| 5,997,588 A | 12/1999 | Goodwin | |
| D419,652 S | 1/2000 | Hall et al. | |
| 6,013,553 A | 1/2000 | Wallace | |
| 6,015,465 A | 1/2000 | Kholodenko et al. | |
| 6,017,779 A | 1/2000 | Miyasaka | |
| 6,024,799 A | 2/2000 | Chen | |
| 6,035,101 A | 3/2000 | Sajoto et al. | |
| 6,042,652 A | 3/2000 | Hyun | |
| 6,044,860 A | 4/2000 | Nue | |
| 6,050,506 A | 4/2000 | Guo et al. | |
| 6,060,691 A | 5/2000 | Minami et al. | |
| 6,074,443 A | 6/2000 | Venkatesh | |
| 6,083,321 A | 7/2000 | Lei et al. | |
| 6,086,677 A | 7/2000 | Umotoy et al. | |
| 6,099,302 A | 8/2000 | Hong et al. | |
| 6,122,036 A | 9/2000 | Yamasaki et al. | |
| 6,124,600 A | 9/2000 | Moroishi et al. | |
| 6,125,789 A | 10/2000 | Gupta et al. | |
| 6,129,044 A | 10/2000 | Zhao et al. | |
| 6,137,240 A | 10/2000 | Bogdan et al. | |
| 6,140,252 A | 10/2000 | Cho et al. | |
| 6,148,761 A | 11/2000 | Majewski et al. | |
| 6,160,244 A | 12/2000 | Ohashi | |
| 6,161,500 A | 12/2000 | Kopacz et al. | |
| 6,162,323 A | 12/2000 | Koshimizu et al. | |
| 6,180,979 B1 | 1/2001 | Hofmann et al. | |
| 6,187,691 B1 | 2/2001 | Fukuda | |
| 6,194,037 B1 | 2/2001 | Terasaki et al. | |
| 6,201,999 B1 | 3/2001 | Jevtic | |
| 6,207,932 B1 | 3/2001 | Yoo | |
| 6,250,250 B1 | 6/2001 | Maishev et al. | |
| 6,271,148 B1 | 8/2001 | Kao | |
| 6,274,878 B1 | 8/2001 | Li et al. | |
| 6,287,965 B1 | 9/2001 | Kang et al. | |
| D449,873 S | 10/2001 | Bronson | |
| 6,296,909 B1 | 10/2001 | Spitsberg | |
| 6,299,133 B2 | 10/2001 | Waragai et al. | |
| 6,302,964 B1 | 10/2001 | Umotoy et al. | |

(56) References Cited

U.S. PATENT DOCUMENTS

| | | | |
|---|---|---|---|
| 6,303,523 B2 | 10/2001 | Cheung | |
| 6,305,898 B1 | 10/2001 | Yamagishi et al. | |
| 6,312,525 B1 | 11/2001 | Bright et al. | |
| 6,315,512 B1 | 11/2001 | Tabrizi et al. | |
| D451,893 S | 12/2001 | Robson | |
| D452,220 S | 12/2001 | Robson | |
| 6,326,597 B1 | 12/2001 | Lubomirsky et al. | |
| 6,329,297 B1 | 12/2001 | Balish | |
| 6,342,427 B1 | 1/2002 | Choi et al. | |
| 6,347,636 B1 | 2/2002 | Xia | |
| 6,352,945 B1 | 3/2002 | Matsuki | |
| 6,367,410 B1 | 4/2002 | Leahey et al. | |
| 6,368,987 B1 | 4/2002 | Kopacz et al. | |
| 6,370,796 B1 | 4/2002 | Zucker | |
| 6,372,583 B1 * | 4/2002 | Tyagi | 438/300 |
| 6,374,831 B1 | 4/2002 | Chandran | |
| 6,375,312 B1 | 4/2002 | Ikeda et al. | |
| D457,609 S | 5/2002 | Piano | |
| 6,383,566 B1 | 5/2002 | Zagdoun | |
| 6,383,955 B1 | 5/2002 | Matsuki | |
| 6,387,207 B1 | 5/2002 | Janakiraman | |
| 6,391,803 B1 | 5/2002 | Kim et al. | |
| 6,398,184 B1 | 6/2002 | Sowada et al. | |
| 6,410,459 B2 | 6/2002 | Blalock et al. | |
| 6,413,321 B1 | 7/2002 | Kim et al. | |
| 6,413,583 B1 | 7/2002 | Moghadam et al. | |
| 6,420,279 B1 | 7/2002 | Ono et al. | |
| D461,233 S | 8/2002 | Whalen | |
| D461,882 S | 8/2002 | Piano | |
| 6,435,798 B1 | 8/2002 | Satoh | |
| 6,436,819 B1 | 8/2002 | Zhang | |
| 6,437,444 B2 | 8/2002 | Andideh | |
| 6,446,573 B2 | 9/2002 | Hirayama et al. | |
| 6,450,757 B1 | 9/2002 | Saeki | |
| 6,454,860 B2 | 9/2002 | Metzner et al. | |
| 6,455,445 B2 | 9/2002 | Matsuki | |
| 6,461,435 B1 | 10/2002 | Littau et al. | |
| 6,468,924 B2 | 10/2002 | Lee | |
| 6,472,266 B1 | 10/2002 | Yu et al. | |
| 6,475,930 B1 | 11/2002 | Junker et al. | |
| 6,478,872 B1 | 11/2002 | Chae et al. | |
| 6,482,331 B2 | 11/2002 | Lu et al. | |
| 6,482,663 B1 | 11/2002 | Bucklund | |
| 6,483,989 B1 | 11/2002 | Okada et al. | |
| 6,499,533 B2 | 12/2002 | Yamada | |
| 6,503,562 B1 | 1/2003 | Saito et al. | |
| 6,503,826 B1 | 1/2003 | Oda | |
| 6,511,539 B1 | 1/2003 | Raaijmakers | |
| 6,521,295 B1 | 2/2003 | Remington | |
| 6,521,547 B1 | 2/2003 | Chang et al. | |
| 6,528,430 B2 | 3/2003 | Kwan | |
| 6,528,767 B2 | 3/2003 | Bagley et al. | |
| 6,531,193 B2 | 3/2003 | Fonash et al. | |
| 6,531,412 B2 | 3/2003 | Conti et al. | |
| 6,534,395 B2 | 3/2003 | Werkhoven et al. | |
| 6,569,239 B2 | 5/2003 | Arai et al. | |
| 6,573,030 B1 | 6/2003 | Fairbairn et al. | |
| 6,576,062 B2 | 6/2003 | Matsuse | |
| 6,576,064 B2 | 6/2003 | Griffiths et al. | |
| 6,576,300 B1 | 6/2003 | Berry et al. | |
| 6,579,833 B1 | 6/2003 | McNallan et al. | |
| 6,583,048 B1 | 6/2003 | Vincent et al. | |
| 6,590,251 B2 | 7/2003 | Kang et al. | |
| 6,594,550 B1 | 7/2003 | Okrah | |
| 6,598,559 B1 | 7/2003 | Vellore et al. | |
| 6,627,503 B2 | 9/2003 | Ma et al. | |
| 6,632,478 B2 | 10/2003 | Gaillard et al. | |
| 6,633,364 B2 | 10/2003 | Hayashi | |
| 6,635,117 B1 | 10/2003 | Kinnard et al. | |
| 6,638,839 B2 | 10/2003 | Deng et al. | |
| 6,645,304 B2 | 11/2003 | Yamaguchi | |
| 6,648,974 B1 | 11/2003 | Ogliari et al. | |
| 6,649,921 B1 | 11/2003 | Cekic et al. | |
| 6,652,924 B2 | 11/2003 | Sherman | |
| 6,673,196 B1 | 1/2004 | Oyabu | |
| 6,682,973 B1 | 1/2004 | Paton et al. | |
| D486,891 S | 2/2004 | Cronce | |
| 6,688,784 B1 | 2/2004 | Templeton | |
| 6,689,220 B1 | 2/2004 | Nguyen | |
| 6,692,575 B1 | 2/2004 | Omstead et al. | |
| 6,692,576 B2 | 2/2004 | Halpin et al. | |
| 6,699,003 B2 | 3/2004 | Saeki | |
| 6,709,989 B2 | 3/2004 | Ramdani et al. | |
| 6,710,364 B2 | 3/2004 | Guldi et al. | |
| 6,713,824 B1 * | 3/2004 | Mikata | C23C 16/24 257/407 |
| 6,716,571 B2 | 4/2004 | Gabriel | |
| 6,730,614 B1 | 5/2004 | Lim et al. | |
| 6,734,090 B2 | 5/2004 | Agarwala et al. | |
| 6,740,853 B1 | 5/2004 | Kitayama et al. | |
| 6,743,475 B2 | 6/2004 | Skarp et al. | |
| 6,743,738 B2 | 6/2004 | Todd et al. | |
| 6,753,507 B2 | 6/2004 | Fure et al. | |
| 6,756,318 B2 | 6/2004 | Nguyen et al. | |
| 6,759,098 B2 | 7/2004 | Han | |
| 6,784,108 B1 | 8/2004 | Donohoe et al. | |
| 6,815,350 B2 | 11/2004 | Kim et al. | |
| 6,820,570 B2 | 11/2004 | Kilpela et al. | |
| 6,821,910 B2 | 11/2004 | Adomaitis et al. | |
| 6,824,665 B2 | 11/2004 | Shelnut et al. | |
| 6,825,134 B2 | 11/2004 | Law et al. | |
| 6,846,515 B2 | 1/2005 | Vrtis | |
| 6,847,014 B1 | 1/2005 | Benjamin et al. | |
| 6,858,524 B2 | 2/2005 | Haukka et al. | |
| 6,858,547 B2 | 2/2005 | Metzner | |
| 6,863,019 B2 | 3/2005 | Shamouilian | |
| 6,864,041 B2 | 3/2005 | Brown | |
| 6,872,258 B2 | 3/2005 | Park et al. | |
| 6,872,259 B2 | 3/2005 | Strang | |
| 6,874,480 B1 | 4/2005 | Ismailov | |
| 6,875,677 B1 | 4/2005 | Conley, Jr. et al. | |
| 6,876,017 B2 | 4/2005 | Goodner | |
| 6,884,066 B2 | 4/2005 | Nguyen et al. | |
| 6,884,319 B2 | 4/2005 | Kim | |
| 6,889,864 B2 | 5/2005 | Lindfors et al. | |
| 6,895,158 B2 | 5/2005 | Alyward et al. | |
| 6,899,507 B2 | 5/2005 | Yamagishi et al. | |
| 6,909,839 B2 | 6/2005 | Wang et al. | |
| 6,911,092 B2 | 6/2005 | Sneh | |
| 6,913,796 B2 | 7/2005 | Albano et al. | |
| 6,930,059 B2 | 8/2005 | Conley, Jr. et al. | |
| 6,935,269 B2 | 8/2005 | Lee et al. | |
| 6,939,817 B2 | 9/2005 | Sandhu et al. | |
| 6,951,587 B1 | 10/2005 | Narushima | |
| 6,953,609 B2 | 10/2005 | Carollo | |
| 6,955,836 B2 | 10/2005 | Kumagai et al. | |
| 6,972,478 B1 | 12/2005 | Waite et al. | |
| 6,974,781 B2 | 12/2005 | Timmermans et al. | |
| 6,976,822 B2 | 12/2005 | Woodruff | |
| 6,984,595 B1 | 1/2006 | Yamazaki | |
| 6,990,430 B2 | 1/2006 | Hosek | |
| 7,021,881 B2 | 4/2006 | Yamagishi | |
| 7,045,430 B2 | 5/2006 | Ahn et al. | |
| 7,049,247 B2 | 5/2006 | Gates et al. | |
| 7,053,009 B2 | 5/2006 | Conley, Jr. et al. | |
| 7,055,875 B2 | 6/2006 | Bonora | |
| 7,071,051 B1 | 7/2006 | Jeon et al. | |
| 7,084,079 B2 | 8/2006 | Conti et al. | |
| 7,088,003 B2 | 8/2006 | Gates et al. | |
| 7,092,287 B2 | 8/2006 | Beulens et al. | |
| 7,098,149 B2 | 8/2006 | Lukas | |
| 7,109,098 B1 | 9/2006 | Ramaswamy et al. | |
| 7,115,838 B2 | 10/2006 | Kurara et al. | |
| 7,122,085 B2 | 10/2006 | Shero et al. | |
| 7,122,222 B2 | 10/2006 | Xiao et al. | |
| 7,129,165 B2 | 10/2006 | Basol et al. | |
| 7,132,360 B2 | 11/2006 | Schaeffer et al. | |
| 7,135,421 B2 | 11/2006 | Ahn et al. | |
| 7,143,897 B1 | 12/2006 | Guzman et al. | |
| 7,147,766 B2 | 12/2006 | Uzoh et al. | |
| 7,153,542 B2 | 12/2006 | Nguyen et al. | |
| 7,163,721 B2 | 1/2007 | Zhang et al. | |
| 7,163,900 B2 | 1/2007 | Weber | |
| 7,172,497 B2 | 2/2007 | Basol et al. | |

(56) References Cited

U.S. PATENT DOCUMENTS

| | | |
|---|---|---|
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,246 B2 | 4/2007 | MacNeil et al. |
| 7,205,247 B2 | 4/2007 | Lee et al. |
| 7,207,763 B2 | 4/2007 | Lee |
| 7,208,389 B1 | 4/2007 | Tipton et al. |
| 7,211,524 B2 | 5/2007 | Ryu et al. |
| 7,234,476 B2 | 6/2007 | Arai |
| 7,235,137 B2 | 6/2007 | Kitayama et al. |
| 7,235,482 B2 | 6/2007 | Wu |
| 7,235,501 B2 | 6/2007 | Ahn et al. |
| 7,238,596 B2 | 7/2007 | Kouvetakis et al. |
| 7,265,061 B1 | 9/2007 | Cho et al. |
| D553,104 S | 10/2007 | Oohashi et al. |
| 7,290,813 B2 | 11/2007 | Bonora |
| 7,294,581 B2 | 11/2007 | Haverkort et al. |
| 7,297,641 B2 | 11/2007 | Todd et al. |
| 7,298,009 B2 | 11/2007 | Yan et al. |
| D557,226 S | 12/2007 | Uchino et al. |
| 7,307,178 B2 | 12/2007 | Kiyomori et al. |
| 7,312,148 B2 | 12/2007 | Ramaswamy et al. |
| 7,312,162 B2 | 12/2007 | Ramaswamy et al. |
| 7,312,494 B2 | 12/2007 | Ahn et al. |
| 7,323,401 B2 | 1/2008 | Ramaswamy et al. |
| 7,326,657 B2 | 2/2008 | Xia et al. |
| 7,327,948 B1 | 2/2008 | Shrinivasan |
| 7,329,947 B2 | 2/2008 | Adachi et al. |
| 7,335,611 B2 | 2/2008 | Ramaswamy et al. |
| 7,354,847 B2 | 4/2008 | Chan et al. |
| 7,357,138 B2 | 4/2008 | Ji et al. |
| 7,393,418 B2 | 7/2008 | Yokogawa |
| 7,393,736 B2 | 7/2008 | Ahn et al. |
| 7,393,765 B2 | 7/2008 | Hanawa et al. |
| 7,396,491 B2 | 7/2008 | Marking et al. |
| 7,399,388 B2 | 7/2008 | Moghadam et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,422,775 B2 | 9/2008 | Ramaswamy et al. |
| 7,429,532 B2 | 9/2008 | Ramaswamy et al. |
| 7,431,966 B2 | 10/2008 | Derderian et al. |
| 7,437,060 B2 | 10/2008 | Wang et al. |
| 7,442,275 B2 | 10/2008 | Cowans |
| 7,476,291 B2 | 1/2009 | Wang et al. |
| 7,479,198 B2 | 1/2009 | Guffrey |
| D585,968 S | 2/2009 | Elkins et al. |
| 7,489,389 B2 | 2/2009 | Shibazaki |
| 7,498,242 B2 | 3/2009 | Kumar et al. |
| 7,501,292 B2 | 3/2009 | Matsushita et al. |
| 7,503,980 B2 | 3/2009 | Kida et al. |
| 7,514,375 B1 | 4/2009 | Shanker et al. |
| D593,969 S | 6/2009 | Li |
| 7,541,297 B2 | 6/2009 | Mallick et al. |
| 7,547,363 B2 | 6/2009 | Tomiyasu et al. |
| 7,566,891 B2 | 7/2009 | Rocha-Alvarez et al. |
| 7,575,968 B2 | 8/2009 | Sadaka et al. |
| 7,579,785 B2 | 8/2009 | DeVincentis et al. |
| 7,582,555 B1 | 9/2009 | Lang |
| 7,589,003 B2 | 9/2009 | Kouvetakis et al. |
| 7,589,029 B2 | 9/2009 | Derderian et al. |
| D602,575 S | 10/2009 | Breda |
| 7,601,223 B2 | 10/2009 | Lindfors et al. |
| 7,601,225 B2 | 10/2009 | Tuominen et al. |
| 7,611,980 B2 | 11/2009 | Wells et al. |
| 7,618,226 B2 | 11/2009 | Takizawa |
| 7,629,277 B2 | 12/2009 | Ghatnagar et al. |
| 7,632,549 B2 | 12/2009 | Goundar |
| 7,640,142 B2 | 12/2009 | Tachikawa et al. |
| 7,651,583 B2 | 1/2010 | Kent et al. |
| 7,651,961 B2 | 1/2010 | Clark |
| D609,655 S | 2/2010 | Sugimoto |
| 7,678,197 B2 | 3/2010 | Maki |
| 7,682,657 B2 | 3/2010 | Sherman |
| D613,829 S | 4/2010 | Griffin et al. |
| D614,153 S | 4/2010 | Fondurulia et al. |
| D614,267 S | 4/2010 | Breda |
| D614,268 S | 4/2010 | Breda |
| 7,690,881 B2 | 4/2010 | Yamagishi |
| 7,691,205 B2 | 4/2010 | Ikedo |
| 7,713,874 B2 | 5/2010 | Milligan |
| 7,720,560 B2 | 5/2010 | Menser et al. |
| 7,723,648 B2 | 5/2010 | Tsukamoto et al. |
| 7,727,864 B2 | 6/2010 | Elers |
| 7,732,343 B2 | 6/2010 | Niroomand et al. |
| 7,740,705 B2 | 6/2010 | Li |
| 7,767,262 B2 | 8/2010 | Clark |
| 7,780,440 B2 | 8/2010 | Shibagaki et al. |
| 7,789,965 B2 | 9/2010 | Matsushita et al. |
| 7,790,633 B1 | 9/2010 | Tarafdar et al. |
| 7,803,722 B2 | 9/2010 | Liang |
| 7,807,578 B2 | 10/2010 | Bencher et al. |
| 7,816,278 B2 | 10/2010 | Reed et al. |
| 7,824,492 B2 | 11/2010 | Tois et al. |
| 7,825,040 B1 | 11/2010 | Fukazawa et al. |
| 7,833,353 B2 | 11/2010 | Furukawahara et al. |
| 7,838,084 B2 | 11/2010 | Derderian et al. |
| 7,842,518 B2 | 11/2010 | Miyajima |
| 7,842,622 B1 | 11/2010 | Lee et al. |
| D629,874 S | 12/2010 | Hermans |
| 7,851,019 B2 | 12/2010 | Tuominen et al. |
| 7,851,232 B2 | 12/2010 | van Schravendijk et al. |
| 7,865,070 B2 | 1/2011 | Nakamura |
| 7,884,918 B2 | 2/2011 | Hattori |
| 7,888,233 B1 | 2/2011 | Gauri |
| D634,719 S | 3/2011 | Yasuda et al. |
| 7,897,215 B1 | 3/2011 | Fair et al. |
| 7,902,582 B2 | 3/2011 | Forbes et al. |
| 7,910,288 B2 | 3/2011 | Abatchev et al. |
| 7,915,139 B1 | 3/2011 | Lang |
| 7,919,416 B2 | 4/2011 | Lee et al. |
| 7,925,378 B2 | 4/2011 | Gilchrist et al. |
| 7,935,940 B1 | 5/2011 | Smargiassi |
| 7,963,736 B2 | 6/2011 | Takizawa et al. |
| 7,972,980 B2 | 7/2011 | Lee et al. |
| 7,981,751 B2 | 7/2011 | Zhu et al. |
| D643,055 S | 8/2011 | Takahashi |
| 7,994,721 B2 | 8/2011 | Espiau et al. |
| 8,003,174 B2 | 8/2011 | Fukazawa |
| 8,004,198 B2 | 8/2011 | Bakre et al. |
| 8,038,835 B2 | 10/2011 | Hayashi et al. |
| 8,041,197 B2 | 10/2011 | Kasai et al. |
| 8,041,450 B2 | 10/2011 | Takizawa et al. |
| 8,055,378 B2 | 11/2011 | Numakura |
| 8,060,252 B2 | 11/2011 | Gage et al. |
| 8,071,451 B2 | 12/2011 | Berry |
| 8,071,452 B2 | 12/2011 | Raisanen |
| 8,072,578 B2 | 12/2011 | Yasuda |
| 8,076,230 B2 | 12/2011 | Wei |
| 8,076,237 B2 | 12/2011 | Uzoh |
| 8,082,946 B2 | 12/2011 | Laverdiere et al. |
| D652,896 S | 1/2012 | Gether |
| 8,092,604 B2 | 1/2012 | Tomiyasu et al. |
| D653,734 S | 2/2012 | Sisk |
| D655,055 S | 2/2012 | Toll |
| 8,137,462 B2 | 3/2012 | Fondurulia et al. |
| 8,137,465 B1 | 3/2012 | Shrinivasan et al. |
| 8,138,676 B2 | 3/2012 | Mills |
| 8,142,862 B2 | 3/2012 | Lee et al. |
| 8,143,174 B2 | 3/2012 | Xia et al. |
| 8,147,242 B2 | 4/2012 | Shibagaki et al. |
| 8,173,554 B2 | 5/2012 | Lee et al. |
| 8,187,951 B1 | 5/2012 | Wang |
| 8,192,901 B2 | 6/2012 | Kageyama |
| 8,196,234 B2 | 6/2012 | Glunk |
| 8,197,915 B2 | 6/2012 | Oka et al. |
| 8,216,380 B2 | 7/2012 | White et al. |
| 8,231,799 B2 | 7/2012 | Bera et al. |
| D665,055 S | 8/2012 | Yanagisawa et al. |
| 8,241,991 B2 | 8/2012 | Hsieh et al. |
| 8,242,031 B2 | 8/2012 | Mallick et al. |
| 8,252,114 B2 | 8/2012 | Vukovic |

(56) References Cited

U.S. PATENT DOCUMENTS

| | | | |
|---|---|---|---|
| 8,252,659 B2 | 8/2012 | Huyghebaert et al. |
| 8,252,691 B2 | 8/2012 | Beynet et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,298,951 B1 | 10/2012 | Nakano |
| 8,307,472 B1 | 11/2012 | Saxon et al. |
| 8,309,173 B2 | 11/2012 | Tuominen et al. |
| 8,323,413 B2 | 12/2012 | Son |
| 8,329,599 B2 | 12/2012 | Fukazawa et al. |
| 8,334,219 B2 | 12/2012 | Lee et al. |
| 8,367,528 B2 | 2/2013 | Bauer et al. |
| 8,372,204 B2 | 2/2013 | Nakamura |
| 8,394,466 B2 | 3/2013 | Hong et al. |
| 8,415,259 B2 | 4/2013 | Lee et al. |
| 8,440,259 B2 | 5/2013 | Chiang et al. |
| 8,444,120 B2 | 5/2013 | Gregg et al. |
| 8,465,811 B2 | 6/2013 | Ueda |
| 8,466,411 B2 | 6/2013 | Arai |
| 8,470,187 B2 | 6/2013 | Ha |
| 8,484,846 B2 | 7/2013 | Dhindsa |
| 8,496,756 B2 | 7/2013 | Cruse et al. |
| 8,506,713 B2 | 8/2013 | Takagi |
| 8,535,767 B1 | 9/2013 | Kimura |
| D691,974 S | 10/2013 | Osada et al. |
| 8,551,892 B2 | 10/2013 | Nakano |
| 8,563,443 B2 | 10/2013 | Fukazawa |
| 8,569,184 B2 | 10/2013 | Oka |
| 8,591,659 B1 | 11/2013 | Fang et al. |
| 8,592,005 B2 | 11/2013 | Ueda |
| 8,608,885 B2 | 12/2013 | Goto et al. |
| 8,647,722 B2 | 2/2014 | Kobayashi et al. |
| 8,664,627 B1 | 3/2014 | Ishikawa et al. |
| 8,669,185 B2 | 3/2014 | Onizawa |
| 8,683,943 B2 | 4/2014 | Onodera et al. |
| 8,711,338 B2 | 4/2014 | Liu et al. |
| D705,745 S | 5/2014 | Kurs et al. |
| 8,720,965 B2 | 5/2014 | Hino et al. |
| 8,722,546 B2 | 5/2014 | Fukazawa et al. |
| 8,726,837 B2 | 5/2014 | Patalay et al. |
| 8,728,832 B2 | 5/2014 | Raisanen et al. |
| 8,742,668 B2 | 6/2014 | Nakano et al. |
| 8,764,085 B2 | 7/2014 | Urabe |
| 8,784,950 B2 | 7/2014 | Fukazawa et al. |
| 8,784,951 B2 | 7/2014 | Fukazawa et al. |
| 8,785,215 B2 | 7/2014 | Kobayashi et al. |
| 8,790,749 B2 | 7/2014 | Omori et al. |
| 8,802,201 B2 | 8/2014 | Raisanen et al. |
| 8,820,809 B2 | 9/2014 | Ando et al. |
| 8,845,806 B2 | 9/2014 | Aida et al. |
| D715,410 S | 10/2014 | Lohmann |
| 8,864,202 B1 | 10/2014 | Schrameyer |
| D716,742 S | 11/2014 | Jang et al. |
| 8,877,655 B2 | 11/2014 | Shero et al. |
| 8,883,270 B2 | 11/2014 | Shero et al. |
| 8,901,016 B2 | 12/2014 | Ha et al. |
| 8,911,826 B2 | 12/2014 | Adachi et al. |
| 8,912,101 B2 | 12/2014 | Tsuji et al. |
| D720,838 S | 1/2015 | Yamagishi et al. |
| 8,940,646 B1 | 1/2015 | Chandrasekharan |
| D724,701 S | 3/2015 | Yamagishi et al. |
| 8,967,608 B2 | 3/2015 | Mitsumori et al. |
| 8,986,456 B2 | 3/2015 | Fondurulia et al. |
| 8,991,887 B2 | 3/2015 | Shin et al. |
| 8,993,054 B2 | 3/2015 | Jung et al. |
| D726,884 S | 4/2015 | Yamagishi et al. |
| 9,005,539 B2 | 4/2015 | Halpin et al. |
| 9,017,481 B1 | 4/2015 | Pettinger et al. |
| 9,018,093 B2 | 4/2015 | Tsuji et al. |
| 9,018,111 B2 | 4/2015 | Milligan et al. |
| 9,021,985 B2 | 5/2015 | Alokozai et al. |
| 9,023,737 B2 | 5/2015 | Beynet et al. |
| 9,029,253 B2 | 5/2015 | Milligan et al. |
| 9,029,272 B1 | 5/2015 | Nakano |
| D732,644 S | 6/2015 | Yamagishi et al. |
| D733,261 S | 6/2015 | Yamagishi et al. |
| D733,843 S | 7/2015 | Yamagishi et al. |
| 9,096,931 B2 | 8/2015 | Yednak et al. |
| 9,117,657 B2 | 8/2015 | Nakano et al. |
| 9,123,510 B2 | 9/2015 | Nakano et al. |
| 9,136,108 B2 | 9/2015 | Matsushita et al. |
| 9,142,393 B2 | 9/2015 | Okabe et al. |
| 9,171,716 B2 | 10/2015 | Fukuda |
| 9,190,263 B2 | 11/2015 | Ishikawa et al. |
| 9,202,727 B2 | 12/2015 | Dunn et al. |
| 2001/0017103 A1 | 8/2001 | Takeshita et al. |
| 2001/0018267 A1 | 8/2001 | Shinriki et al. |
| 2001/0019777 A1 | 9/2001 | Tanaka et al. |
| 2001/0019900 A1 | 9/2001 | Hasegawa |
| 2001/0028924 A1 | 10/2001 | Sherman |
| 2001/0046765 A1 | 11/2001 | Cappellani et al. |
| 2001/0049202 A1 | 12/2001 | Maeda et al. |
| 2002/0001974 A1 | 1/2002 | Chan |
| 2002/0011210 A1 | 1/2002 | Satoh et al. |
| 2002/0014204 A1 | 2/2002 | Pyo |
| 2002/0064592 A1 | 5/2002 | Datta et al. |
| 2002/0076507 A1 | 6/2002 | Chiang et al. |
| 2002/0079714 A1 | 6/2002 | Soucy et al. |
| 2002/0088542 A1 | 7/2002 | Nishikawa et al. |
| 2002/0098627 A1 | 7/2002 | Pomarede et al. |
| 2002/0108670 A1 | 8/2002 | Baker et al. |
| 2002/0110991 A1 | 8/2002 | Li |
| 2002/0114886 A1 | 8/2002 | Chou et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2002/0197849 A1 | 12/2002 | Mandal |
| 2003/0003635 A1 | 1/2003 | Paranjpe et al. |
| 2003/0010452 A1 | 1/2003 | Park et al. |
| 2003/0012632 A1 | 1/2003 | Saeki |
| 2003/0019428 A1 | 1/2003 | Ku et al. |
| 2003/0019580 A1 | 1/2003 | Strang |
| 2003/0025146 A1 | 2/2003 | Narwankar et al. |
| 2003/0040158 A1* | 2/2003 | Saitoh ............ 438/279 |
| 2003/0042419 A1 | 3/2003 | Katsumata et al. |
| 2003/0049375 A1 | 3/2003 | Nguyen et al. |
| 2003/0054670 A1 | 3/2003 | Wang et al. |
| 2003/0059535 A1 | 3/2003 | Luo et al. |
| 2003/0059980 A1 | 3/2003 | Chen et al. |
| 2003/0066826 A1 | 4/2003 | Lee et al. |
| 2003/0075925 A1 | 4/2003 | Lindfors et al. |
| 2003/0091938 A1 | 5/2003 | Fairbairn et al. |
| 2003/0094133 A1 | 5/2003 | Yoshidome et al. |
| 2003/0111963 A1 | 6/2003 | Tolmachev et al. |
| 2003/0134038 A1 | 7/2003 | Paranjpe |
| 2003/0141820 A1 | 7/2003 | White et al. |
| 2003/0157436 A1 | 8/2003 | Manger et al. |
| 2003/0168001 A1 | 9/2003 | Sneh |
| 2003/0170583 A1 | 9/2003 | Nakashima |
| 2003/0180458 A1 | 9/2003 | Sneh |
| 2003/0183156 A1 | 10/2003 | Dando |
| 2003/0198587 A1 | 10/2003 | Kaloyeros |
| 2003/0209323 A1 | 11/2003 | Yokogaki |
| 2003/0228772 A1 | 12/2003 | Cowans |
| 2003/0232138 A1 | 12/2003 | Tuominen et al. |
| 2004/0009679 A1 | 1/2004 | Yeo et al. |
| 2004/0013577 A1 | 1/2004 | Ganguli et al. |
| 2004/0013818 A1 | 1/2004 | Moon et al. |
| 2004/0018307 A1 | 1/2004 | Park et al. |
| 2004/0018750 A1 | 1/2004 | Sophie et al. |
| 2004/0023516 A1 | 2/2004 | Londergan et al. |
| 2004/0029052 A1 | 2/2004 | Park et al. |
| 2004/0036129 A1 | 2/2004 | Forbes et al. |
| 2004/0063289 A1 | 4/2004 | Ohta |
| 2004/0071897 A1 | 4/2004 | Verplancken et al. |
| 2004/0077182 A1 | 4/2004 | Lim et al. |
| 2004/0079960 A1 | 4/2004 | Shakuda |
| 2004/0080697 A1 | 4/2004 | Song |
| 2004/0082171 A1 | 4/2004 | Shin et al. |
| 2004/0101622 A1 | 5/2004 | Park et al. |
| 2004/0103914 A1 | 6/2004 | Cheng et al. |
| 2004/0106249 A1 | 6/2004 | Huotari |
| 2004/0124549 A1 | 7/2004 | Curran |

(56) References Cited

U.S. PATENT DOCUMENTS

| | | |
|---|---|---|
| 2004/0134429 A1 | 7/2004 | Yamanaka |
| 2004/0144980 A1 | 7/2004 | Ahn et al. |
| 2004/0146644 A1 | 7/2004 | Xia et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0209477 A1 | 10/2004 | Buxbaum et al. |
| 2004/0212947 A1 | 10/2004 | Nguyen |
| 2004/0219793 A1 | 11/2004 | Hishiya et al. |
| 2004/0221807 A1 | 11/2004 | Verghese et al. |
| 2004/0247779 A1 | 12/2004 | Selvamanickam et al. |
| 2004/0261712 A1 | 12/2004 | Hayashi et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0034674 A1 | 2/2005 | Ono |
| 2005/0037154 A1 | 2/2005 | Koh et al. |
| 2005/0051093 A1 | 3/2005 | Makino et al. |
| 2005/0054228 A1 | 3/2005 | March |
| 2005/0059262 A1 | 3/2005 | Yin et al. |
| 2005/0064207 A1 | 3/2005 | Senzaki et al. |
| 2005/0064719 A1 | 3/2005 | Liu |
| 2005/0066893 A1 | 3/2005 | Soininen |
| 2005/0069651 A1 | 3/2005 | Miyoshi |
| 2005/0070123 A1 | 3/2005 | Hirano |
| 2005/0070729 A1 | 3/2005 | Kiyomori et al. |
| 2005/0072357 A1 | 4/2005 | Shero et al. |
| 2005/0074983 A1 | 4/2005 | Shinriki et al. |
| 2005/0092249 A1 | 5/2005 | Kilpela et al. |
| 2005/0095770 A1 | 5/2005 | Kumagai et al. |
| 2005/0100669 A1 | 5/2005 | Kools et al. |
| 2005/0101154 A1 | 5/2005 | Huang |
| 2005/0106893 A1 | 5/2005 | Wilk |
| 2005/0110069 A1 | 5/2005 | Kil et al. |
| 2005/0120962 A1 | 6/2005 | Ushioda et al. |
| 2005/0123690 A1 | 6/2005 | Derderian et al. |
| 2005/0133161 A1 | 6/2005 | Carpenter et al. |
| 2005/0142361 A1 | 6/2005 | Nakanishi |
| 2005/0145338 A1 | 7/2005 | Park et al. |
| 2005/0153571 A1 | 7/2005 | Senzaki |
| 2005/0173003 A1 | 8/2005 | Laverdiere et al. |
| 2005/0181535 A1 | 8/2005 | Yun et al. |
| 2005/0187647 A1 | 8/2005 | Wang et al. |
| 2005/0191828 A1 | 9/2005 | Al-Bayati et al. |
| 2005/0208718 A1 | 9/2005 | Lim et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0221618 A1 | 10/2005 | AmRhein et al. |
| 2005/0223994 A1 | 10/2005 | Blomiley et al. |
| 2005/0227502 A1 | 10/2005 | Schmitt et al. |
| 2005/0229848 A1 | 10/2005 | Shinriki |
| 2005/0229972 A1 | 10/2005 | Hoshi et al. |
| 2005/0241176 A1 | 11/2005 | Shero et al. |
| 2005/0241763 A1 | 11/2005 | Huang et al. |
| 2005/0255257 A1 | 11/2005 | Choi et al. |
| 2005/0258280 A1 | 11/2005 | Goto et al. |
| 2005/0260347 A1 | 11/2005 | Narwankar et al. |
| 2005/0260850 A1 | 11/2005 | Loke |
| 2005/0263075 A1 | 12/2005 | Wang et al. |
| 2005/0263932 A1 | 12/2005 | Heugel |
| 2005/0271813 A1 | 12/2005 | Kher et al. |
| 2005/0274323 A1 | 12/2005 | Seidel et al. |
| 2005/0282101 A1 | 12/2005 | Adachi |
| 2005/0287725 A1 | 12/2005 | Kitagawa |
| 2005/0287771 A1 | 12/2005 | Seamons et al. |
| 2006/0013946 A1 | 1/2006 | Park et al. |
| 2006/0014384 A1 | 1/2006 | Lee et al. |
| 2006/0014397 A1 | 1/2006 | Seamons et al. |
| 2006/0016783 A1 | 1/2006 | Wu et al. |
| 2006/0019033 A1 | 1/2006 | Muthukrishnan et al. |
| 2006/0019502 A1 | 1/2006 | Park et al. |
| 2006/0021703 A1 | 2/2006 | Umotoy et al. |
| 2006/0024439 A2 | 2/2006 | Tuominen et al. |
| 2006/0046518 A1 | 3/2006 | Hill et al. |
| 2006/0051520 A1 | 3/2006 | Behle et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0068121 A1 | 3/2006 | Lee et al. |
| 2006/0068125 A1 | 3/2006 | Radhakrishnan |
| 2006/0105566 A1 | 5/2006 | Waldfried et al. |
| 2006/0110934 A1 | 5/2006 | Fukuchi |
| 2006/0113675 A1 | 6/2006 | Chang et al. |
| 2006/0113806 A1 | 6/2006 | Tsuji et al. |
| 2006/0128168 A1 | 6/2006 | Ahn et al. |
| 2006/0130767 A1 | 6/2006 | Herchen |
| 2006/0137609 A1 | 6/2006 | Puchacz et al. |
| 2006/0147626 A1 | 7/2006 | Blomberg |
| 2006/0148180 A1 | 7/2006 | Ahn et al. |
| 2006/0163612 A1 | 7/2006 | Kouvetakis et al. |
| 2006/0172531 A1 | 8/2006 | Lin et al. |
| 2006/0191555 A1 | 8/2006 | Yoshida et al. |
| 2006/0193979 A1 | 8/2006 | Meiere et al. |
| 2006/0199357 A1 | 9/2006 | Wan et al. |
| 2006/0205223 A1 | 9/2006 | Smayling |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0236934 A1 | 10/2006 | Choi et al. |
| 2006/0240574 A1 | 10/2006 | Yoshie |
| 2006/0240662 A1 | 10/2006 | Conley et al. |
| 2006/0251827 A1 | 11/2006 | Nowak |
| 2006/0257563 A1 | 11/2006 | Doh et al. |
| 2006/0257584 A1 | 11/2006 | Derderian et al. |
| 2006/0258078 A1 | 11/2006 | Lee et al. |
| 2006/0258173 A1 | 11/2006 | Xiao et al. |
| 2006/0260545 A1 | 11/2006 | Ramaswamy et al. |
| 2006/0264060 A1 | 11/2006 | Ramaswamy et al. |
| 2006/0264066 A1 | 11/2006 | Bartholomew |
| 2006/0266289 A1 | 11/2006 | Verghese et al. |
| 2006/0269692 A1 | 11/2006 | Balseanu |
| 2006/0278524 A1 | 12/2006 | Stowell |
| 2007/0006806 A1 | 1/2007 | Imai |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0032082 A1 | 2/2007 | Ramaswamy et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0054499 A1 | 3/2007 | Jang |
| 2007/0059948 A1 | 3/2007 | Metzner et al. |
| 2007/0062453 A1 | 3/2007 | Ishikawa |
| 2007/0065578 A1 | 3/2007 | McDougall |
| 2007/0066010 A1 | 3/2007 | Ando |
| 2007/0077355 A1 | 4/2007 | Chacin et al. |
| 2007/0084405 A1 | 4/2007 | Kim |
| 2007/0096194 A1 | 5/2007 | Streck et al. |
| 2007/0098527 A1 | 5/2007 | Hall et al. |
| 2007/0107845 A1 | 5/2007 | Ishizawa et al. |
| 2007/0111545 A1 | 5/2007 | Lee et al. |
| 2007/0116873 A1 | 5/2007 | Li et al. |
| 2007/0123037 A1 | 5/2007 | Lee et al. |
| 2007/0125762 A1 | 6/2007 | Cui et al. |
| 2007/0128538 A1 | 6/2007 | Fairbairn et al. |
| 2007/0134942 A1 | 6/2007 | Ahn et al. |
| 2007/0146621 A1 | 6/2007 | Yeom |
| 2007/0148990 A1 | 6/2007 | DeBoer et al. |
| 2007/0155138 A1 | 7/2007 | Tomasini et al. |
| 2007/0158026 A1 | 7/2007 | Amikura |
| 2007/0163440 A1 | 7/2007 | Kim et al. |
| 2007/0166457 A1 | 7/2007 | Yamoto et al. |
| 2007/0166966 A1 | 7/2007 | Todd et al. |

(56) References Cited

U.S. PATENT DOCUMENTS

| | | |
|---|---|---|
| 2007/0166999 A1 | 7/2007 | Vaartstra |
| 2007/0173071 A1 | 7/2007 | Afzali-Ardakani et al. |
| 2007/0175393 A1 | 8/2007 | Nishimura et al. |
| 2007/0175397 A1 | 8/2007 | Tomiyasu et al. |
| 2007/0186952 A1 | 8/2007 | Honda et al. |
| 2007/0207275 A1 | 9/2007 | Nowak et al. |
| 2007/0209590 A1 | 9/2007 | Li |
| 2007/0210890 A1 | 9/2007 | Hsu et al. |
| 2007/0215048 A1 | 9/2007 | Suzuki et al. |
| 2007/0218200 A1 | 9/2007 | Suzuki et al. |
| 2007/0218705 A1 | 9/2007 | Matsuki et al. |
| 2007/0224777 A1 | 9/2007 | Hamelin |
| 2007/0224833 A1 | 9/2007 | Morisada et al. |
| 2007/0232031 A1 | 10/2007 | Singh et al. |
| 2007/0232071 A1 | 10/2007 | Balseanu et al. |
| 2007/0232501 A1 | 10/2007 | Tonomura |
| 2007/0234955 A1 | 10/2007 | Suzuki et al. |
| 2007/0237697 A1 | 10/2007 | Clark |
| 2007/0241688 A1 | 10/2007 | DeVancentis et al. |
| 2007/0248767 A1 | 10/2007 | Okura |
| 2007/0249131 A1 | 10/2007 | Allen et al. |
| 2007/0251444 A1 | 11/2007 | Gros-Jean et al. |
| 2007/0252244 A1 | 11/2007 | Srividya et al. |
| 2007/0252532 A1 | 11/2007 | DeVancentis et al. |
| 2007/0264807 A1 | 11/2007 | Leone et al. |
| 2007/0275166 A1 | 11/2007 | Thridandam et al. |
| 2007/0277735 A1 | 12/2007 | Mokhlesi et al. |
| 2007/0281496 A1 | 12/2007 | Ingle et al. |
| 2007/0298362 A1 | 12/2007 | Rocha-Alvarez et al. |
| 2008/0003824 A1 | 1/2008 | Padhi et al. |
| 2008/0003838 A1 | 1/2008 | Haukka et al. |
| 2008/0006208 A1 | 1/2008 | Ueno et al. |
| 2008/0023436 A1 | 1/2008 | Gros-Jean et al. |
| 2008/0026574 A1 | 1/2008 | Brcka |
| 2008/0026597 A1 | 1/2008 | Munro et al. |
| 2008/0029790 A1 | 2/2008 | Ahn et al. |
| 2008/0036354 A1 | 2/2008 | Letz et al. |
| 2008/0038485 A1 | 2/2008 | Lukas |
| 2008/0054332 A1 | 3/2008 | Kim et al. |
| 2008/0054813 A1 | 3/2008 | Espiau et al. |
| 2008/0057659 A1 | 3/2008 | Forbes et al. |
| 2008/0061667 A1 | 3/2008 | Gaertner et al. |
| 2008/0066778 A1 | 3/2008 | Matsushita et al. |
| 2008/0075881 A1 | 3/2008 | Won et al. |
| 2008/0076266 A1 | 3/2008 | Fukazawa et al. |
| 2008/0081104 A1 | 4/2008 | Hasebe et al. |
| 2008/0081113 A1 | 4/2008 | Clark |
| 2008/0081121 A1 | 4/2008 | Morita et al. |
| 2008/0085226 A1 | 4/2008 | Fondurulia et al. |
| 2008/0092815 A1 | 4/2008 | Chen et al. |
| 2008/0113094 A1 | 5/2008 | Casper |
| 2008/0113096 A1 | 5/2008 | Mahajani |
| 2008/0113097 A1 | 5/2008 | Mahajani et al. |
| 2008/0124197 A1 | 5/2008 | van der Meulen et al. |
| 2008/0124908 A1 | 5/2008 | Forbes et al. |
| 2008/0133154 A1 | 6/2008 | Krauss |
| 2008/0149031 A1 | 6/2008 | Chu et al. |
| 2008/0152463 A1 | 6/2008 | Chidambaram et al. |
| 2008/0153311 A1 | 6/2008 | Padhi et al. |
| 2008/0173240 A1 | 7/2008 | Furukawahara |
| 2008/0173326 A1 | 7/2008 | Gu et al. |
| 2008/0176375 A1 | 7/2008 | Erben et al. |
| 2008/0182075 A1* | 7/2008 | Chopra ........... H01L 21/823807 428/172 |
| 2008/0182390 A1 | 7/2008 | Lemmi et al. |
| 2008/0191193 A1 | 8/2008 | Li et al. |
| 2008/0199977 A1 | 8/2008 | Weigel et al. |
| 2008/0203487 A1 | 8/2008 | Hohage et al. |
| 2008/0211423 A1 | 9/2008 | Shinmen et al. |
| 2008/0211526 A1 | 9/2008 | Shinma |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0237572 A1 | 10/2008 | Chui et al. |
| 2008/0241384 A1 | 10/2008 | Jeong |
| 2008/0242116 A1 | 10/2008 | Clark |
| 2008/0248310 A1 | 10/2008 | Kim et al. |
| 2008/0261413 A1 | 10/2008 | Mahajani |
| 2008/0264337 A1 | 10/2008 | Sano et al. |
| 2008/0267598 A1 | 10/2008 | Nakamura |
| 2008/0282970 A1 | 11/2008 | Heys et al. |
| 2008/0295872 A1 | 12/2008 | Riker et al. |
| 2008/0299326 A1 | 12/2008 | Fukazawa |
| 2008/0302303 A1 | 12/2008 | Choi et al. |
| 2008/0305246 A1 | 12/2008 | Choi et al. |
| 2008/0305443 A1 | 12/2008 | Nakamura |
| 2008/0315292 A1 | 12/2008 | Ji et al. |
| 2008/0317972 A1 | 12/2008 | Hendriks et al. |
| 2009/0000550 A1 | 1/2009 | Tran et al. |
| 2009/0000551 A1 | 1/2009 | Choi et al. |
| 2009/0011608 A1 | 1/2009 | Nabatame |
| 2009/0020072 A1 | 1/2009 | Mizunaga et al. |
| 2009/0023229 A1 | 1/2009 | Matsushita |
| 2009/0029528 A1 | 1/2009 | Sanchez et al. |
| 2009/0029564 A1 | 1/2009 | Yamashita et al. |
| 2009/0033907 A1 | 2/2009 | Watson |
| 2009/0035947 A1 | 2/2009 | Horii |
| 2009/0041952 A1 | 2/2009 | Yoon et al. |
| 2009/0041984 A1 | 2/2009 | Mayers et al. |
| 2009/0045829 A1 | 2/2009 | Awazu |
| 2009/0050621 A1 | 2/2009 | Awazu |
| 2009/0061644 A1 | 3/2009 | Chiang et al. |
| 2009/0061647 A1 | 3/2009 | Mallick et al. |
| 2009/0085156 A1 | 4/2009 | Dewey et al. |
| 2009/0090382 A1 | 4/2009 | Morisada |
| 2009/0093094 A1* | 4/2009 | Ye et al. .................... 438/197 |
| 2009/0095221 A1 | 4/2009 | Tam et al. |
| 2009/0107404 A1 | 4/2009 | Ogliari et al. |
| 2009/0122293 A1 | 5/2009 | Shibazaki |
| 2009/0136668 A1 | 5/2009 | Gregg et al. |
| 2009/0136683 A1 | 5/2009 | Fukasawa et al. |
| 2009/0139657 A1 | 6/2009 | Lee et al. |
| 2009/0142935 A1 | 6/2009 | Fukuzawa et al. |
| 2009/0146322 A1 | 6/2009 | Weling et al. |
| 2009/0156015 A1 | 6/2009 | Park et al. |
| 2009/0209081 A1 | 8/2009 | Matero |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0246399 A1 | 10/2009 | Goundar |
| 2009/0250955 A1 | 10/2009 | Aoki |
| 2009/0261331 A1 | 10/2009 | Yang et al. |
| 2009/0269506 A1 | 10/2009 | Okura et al. |
| 2009/0275205 A1 | 11/2009 | Kiehlbauch et al. |
| 2009/0277510 A1 | 11/2009 | Shikata |
| 2009/0283041 A1 | 11/2009 | Tomiyasu et al. |
| 2009/0283217 A1 | 11/2009 | Lubomirsky et al. |
| 2009/0286400 A1 | 11/2009 | Heo et al. |
| 2009/0286402 A1 | 11/2009 | Xia et al. |
| 2009/0289300 A1* | 11/2009 | Sasaki et al. .................. 257/344 |
| 2009/0304558 A1 | 12/2009 | Patton |
| 2009/0311857 A1 | 12/2009 | Todd et al. |
| 2010/0001409 A1 | 1/2010 | Humbert et al. |
| 2010/0006031 A1 | 1/2010 | Choi et al. |
| 2010/0014479 A1 | 1/2010 | Kim |
| 2010/0015813 A1 | 1/2010 | McGinnis et al. |
| 2010/0024727 A1 | 2/2010 | Kim et al. |
| 2010/0025796 A1 | 2/2010 | Dabiran |
| 2010/0041179 A1 | 2/2010 | Lee |
| 2010/0041243 A1 | 2/2010 | Cheng et al. |
| 2010/0055312 A1 | 3/2010 | Kato et al. |
| 2010/0055442 A1 | 3/2010 | Kellock |
| 2010/0075507 A1 | 3/2010 | Chang et al. |
| 2010/0089320 A1 | 4/2010 | Kim |
| 2010/0093187 A1 | 4/2010 | Lee et al. |
| 2010/0102417 A1 | 4/2010 | Ganguli et al. |
| 2010/0116209 A1 | 5/2010 | Kato |
| 2010/0124610 A1 | 5/2010 | Aikawa et al. |
| 2010/0124618 A1 | 5/2010 | Kobayashi et al. |
| 2010/0124621 A1 | 5/2010 | Kobayashi et al. |
| 2010/0126605 A1 | 5/2010 | Stones |
| 2010/0130017 A1 | 5/2010 | Luo et al. |

(56) References Cited

U.S. PATENT DOCUMENTS

| | | |
|---|---|---|
| 2010/0134023 A1 | 6/2010 | Mills |
| 2010/0136216 A1 | 6/2010 | Tsuei et al. |
| 2010/0140221 A1 | 6/2010 | Kikuchi et al. |
| 2010/0144162 A1 | 6/2010 | Lee et al. |
| 2010/0151206 A1 | 6/2010 | Wu et al. |
| 2010/0162752 A1 | 7/2010 | Tabata et al. |
| 2010/0170441 A1 | 7/2010 | Won et al. |
| 2010/0178137 A1 | 7/2010 | Chintalapati et al. |
| 2010/0178423 A1 | 7/2010 | Shimizu et al. |
| 2010/0184302 A1 | 7/2010 | Lee et al. |
| 2010/0193501 A1 | 8/2010 | Zucker et al. |
| 2010/0195392 A1 | 8/2010 | Freeman |
| 2010/0221452 A1 | 9/2010 | Kang |
| 2010/0230051 A1 | 9/2010 | Iizuka |
| 2010/0233886 A1 | 9/2010 | Yang et al. |
| 2010/0243166 A1 | 9/2010 | Hayashi et al. |
| 2010/0244688 A1 | 9/2010 | Braun et al. |
| 2010/0255198 A1 | 10/2010 | Cleary et al. |
| 2010/0255625 A1 | 10/2010 | De Vries |
| 2010/0259152 A1 | 10/2010 | Yasuda et al. |
| 2010/0270675 A1 | 10/2010 | Harada |
| 2010/0275846 A1 | 11/2010 | Kitagawa |
| 2010/0285319 A1 | 11/2010 | Kwak et al. |
| 2010/0294199 A1 | 11/2010 | Tran et al. |
| 2010/0301752 A1 | 12/2010 | Bakre et al. |
| 2010/0304047 A1 | 12/2010 | Yang et al. |
| 2010/0307415 A1 | 12/2010 | Shero et al. |
| 2010/0317198 A1 | 12/2010 | Antonelli |
| 2010/0322604 A1 | 12/2010 | Fondurulia et al. |
| 2011/0000619 A1 | 1/2011 | Suh |
| 2011/0006402 A1 | 1/2011 | Zhou |
| 2011/0006406 A1 | 1/2011 | Urbanowicz et al. |
| 2011/0014795 A1 | 1/2011 | Lee |
| 2011/0034039 A1 | 2/2011 | Liang et al. |
| 2011/0048642 A1 | 3/2011 | Mihara et al. |
| 2011/0052833 A1 | 3/2011 | Hanawa et al. |
| 2011/0056513 A1 | 3/2011 | Hombach et al. |
| 2011/0056626 A1 | 3/2011 | Brown et al. |
| 2011/0061810 A1 | 3/2011 | Ganguly et al. |
| 2011/0070380 A1 | 3/2011 | Shero et al. |
| 2011/0081519 A1 | 4/2011 | Dillingh |
| 2011/0086516 A1 | 4/2011 | Lee et al. |
| 2011/0089469 A1 | 4/2011 | Merckling |
| 2011/0097901 A1 | 4/2011 | Banna et al. |
| 2011/0107512 A1 | 5/2011 | Gilbert |
| 2011/0108194 A1 | 5/2011 | Yoshioka et al. |
| 2011/0108741 A1 | 5/2011 | Ingram |
| 2011/0108929 A1 | 5/2011 | Meng |
| 2011/0117490 A1 | 5/2011 | Bae et al. |
| 2011/0117737 A1 | 5/2011 | Agarwala et al. |
| 2011/0124196 A1 | 5/2011 | Lee |
| 2011/0143032 A1 | 6/2011 | Vrtis et al. |
| 2011/0159202 A1 | 6/2011 | Matsushita |
| 2011/0159673 A1 | 6/2011 | Hanawa et al. |
| 2011/0175011 A1 | 7/2011 | Ehrne et al. |
| 2011/0183079 A1 | 7/2011 | Jackson et al. |
| 2011/0183269 A1 | 7/2011 | Zhu |
| 2011/0210468 A1 | 9/2011 | Shannon et al. |
| 2011/0220874 A1 | 9/2011 | Hanrath |
| 2011/0236600 A1 | 9/2011 | Fox et al. |
| 2011/0239936 A1 | 10/2011 | Suzaki et al. |
| 2011/0254052 A1 | 10/2011 | Kouvetakis |
| 2011/0256726 A1 | 10/2011 | Lavoie et al. |
| 2011/0256727 A1 | 10/2011 | Beynet et al. |
| 2011/0256734 A1 | 10/2011 | Hausmann et al. |
| 2011/0265549 A1 | 11/2011 | Cruse et al. |
| 2011/0265951 A1 | 11/2011 | Xu et al. |
| 2011/0275166 A1 | 11/2011 | Shero et al. |
| 2011/0281417 A1 | 11/2011 | Gordon et al. |
| 2011/0283933 A1 | 11/2011 | Makarov et al. |
| 2011/0294075 A1 | 12/2011 | Chen et al. |
| 2011/0308460 A1 | 12/2011 | Hong et al. |
| 2012/0003500 A1 | 1/2012 | Yoshida et al. |
| 2012/0006489 A1 | 1/2012 | Okita |
| 2012/0024479 A1 | 2/2012 | Palagashvili et al. |
| 2012/0043556 A1* | 2/2012 | Dube .................. H01L 21/0237 257/77 |
| 2012/0052681 A1 | 3/2012 | Marsh |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0100464 A1 | 4/2012 | Kageyama |
| 2012/0103264 A1 | 5/2012 | Choi et al. |
| 2012/0103939 A1 | 5/2012 | Wu et al. |
| 2012/0107607 A1 | 5/2012 | Takaki et al. |
| 2012/0114877 A1 | 5/2012 | Lee |
| 2012/0121823 A1 | 5/2012 | Chhabra |
| 2012/0128897 A1 | 5/2012 | Xiao et al. |
| 2012/0135145 A1 | 5/2012 | Je et al. |
| 2012/0156108 A1 | 6/2012 | Fondurulia et al. |
| 2012/0160172 A1 | 6/2012 | Wamura et al. |
| 2012/0164327 A1 | 6/2012 | Sato |
| 2012/0164837 A1 | 6/2012 | Tan et al. |
| 2012/0164842 A1 | 6/2012 | Watanabe |
| 2012/0171391 A1 | 7/2012 | Won |
| 2012/0171874 A1 | 7/2012 | Thridandam et al. |
| 2012/0207456 A1 | 8/2012 | Kim et al. |
| 2012/0212121 A1 | 8/2012 | Lin |
| 2012/0214318 A1 | 8/2012 | Fukazawa et al. |
| 2012/0220139 A1 | 8/2012 | Lee et al. |
| 2012/0225561 A1 | 9/2012 | Watanabe |
| 2012/0240858 A1 | 9/2012 | Taniyama et al. |
| 2012/0270339 A1 | 10/2012 | Xie et al. |
| 2012/0270393 A1 | 10/2012 | Pore et al. |
| 2012/0289053 A1 | 11/2012 | Holland et al. |
| 2012/0295427 A1* | 11/2012 | Bauer ............... H01L 21/02532 438/494 |
| 2012/0304935 A1 | 12/2012 | Oosterlaken et al. |
| 2012/0305196 A1 | 12/2012 | Mori et al. |
| 2012/0315113 A1 | 12/2012 | Hiroki |
| 2012/0318334 A1 | 12/2012 | Bedell et al. |
| 2012/0321786 A1 | 12/2012 | Satitpunwaycha et al. |
| 2012/0322252 A1 | 12/2012 | Son et al. |
| 2012/0325148 A1 | 12/2012 | Yamagishi et al. |
| 2012/0328780 A1 | 12/2012 | Yamagishi et al. |
| 2013/0005122 A1 | 1/2013 | Schwarzenbach et al. |
| 2013/0011983 A1* | 1/2013 | Tsai et al. ....... H01L 21/823807 438/285 |
| 2013/0014697 A1 | 1/2013 | Kanayama |
| 2013/0014896 A1 | 1/2013 | Shoji et al. |
| 2013/0019944 A1 | 1/2013 | Hekmatshoar-Tabari et al. |
| 2013/0019945 A1 | 1/2013 | Hekmatshoar-Tabari et al. |
| 2013/0023129 A1 | 1/2013 | Reed |
| 2013/0048606 A1 | 2/2013 | Mao et al. |
| 2013/0068970 A1 | 3/2013 | Matsushita |
| 2013/0078392 A1 | 3/2013 | Xiao et al. |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0122712 A1 | 5/2013 | Kim et al. |
| 2013/0126515 A1 | 5/2013 | Shero et al. |
| 2013/0129577 A1 | 5/2013 | Halpin et al. |
| 2013/0134148 A1 | 5/2013 | Tachikawa |
| 2013/0180448 A1 | 7/2013 | Sakaue et al. |
| 2013/0183814 A1 | 7/2013 | Huang et al. |
| 2013/0210241 A1 | 8/2013 | Lavoie et al. |
| 2013/0217239 A1 | 8/2013 | Mallick et al. |
| 2013/0217240 A1 | 8/2013 | Mallick et al. |
| 2013/0217241 A1 | 8/2013 | Underwood et al. |
| 2013/0217243 A1 | 8/2013 | Underwood et al. |
| 2013/0224964 A1 | 8/2013 | Fukazawa |
| 2013/0230814 A1 | 9/2013 | Dunn et al. |
| 2013/0256838 A1 | 10/2013 | Sanchez et al. |
| 2013/0264659 A1 | 10/2013 | Jung |
| 2013/0292047 A1 | 11/2013 | Tian et al. |
| 2013/0292676 A1 | 11/2013 | Milligan et al. |
| 2013/0292807 A1 | 11/2013 | Raisanen et al. |
| 2013/0319290 A1 | 12/2013 | Xiao et al. |
| 2013/0323435 A1 | 12/2013 | Xiao et al. |
| 2013/0330165 A1 | 12/2013 | Wimplinger |
| 2013/0330911 A1 | 12/2013 | Huang et al. |
| 2014/0000843 A1 | 1/2014 | Dunn et al. |
| 2014/0014642 A1 | 1/2014 | Elliot et al. |

(56) References Cited

U.S. PATENT DOCUMENTS

| | | | |
|---|---|---|---|
| 2014/0014644 A1 | 1/2014 | Akiba et al. |
| 2014/0020619 A1 | 1/2014 | Vincent et al. |
| 2014/0027884 A1 | 1/2014 | Tang et al. |
| 2014/0036274 A1 | 2/2014 | Marquardt et al. |
| 2014/0056679 A1 | 2/2014 | Yamabe et al. |
| 2014/0060147 A1 | 3/2014 | Sarin et al. |
| 2014/0062304 A1 | 3/2014 | Nakano et al. |
| 2014/0067110 A1 | 3/2014 | Lawson et al. |
| 2014/0073143 A1 | 3/2014 | Alokozai et al. |
| 2014/0077240 A1 | 3/2014 | Roucka et al. |
| 2014/0084341 A1 | 3/2014 | Weeks |
| 2014/0087544 A1 | 3/2014 | Tolle |
| 2014/0096716 A1 | 4/2014 | Chung et al. |
| 2014/0099798 A1 | 4/2014 | Tsuji |
| 2014/0103145 A1 | 4/2014 | White et al. |
| 2014/0116335 A1 | 5/2014 | Tsuji et al. |
| 2014/0120487 A1 | 5/2014 | Kaneko |
| 2014/0127907 A1 | 5/2014 | Yang |
| 2014/0159170 A1 | 6/2014 | Raisanen et al. |
| 2014/0174354 A1 | 6/2014 | Arai |
| 2014/0175054 A1 | 6/2014 | Carlson et al. |
| 2014/0182053 A1 | 7/2014 | Huang |
| 2014/0217065 A1 | 8/2014 | Winkler et al. |
| 2014/0220247 A1 | 8/2014 | Haukka et al. |
| 2014/0225065 A1 | 8/2014 | Rachmady et al. |
| 2014/0227072 A1 | 8/2014 | Lee et al. |
| 2014/0251953 A1 | 9/2014 | Winkler et al. |
| 2014/0251954 A1 | 9/2014 | Winkler et al. |
| 2014/0283747 A1 | 9/2014 | Kasai et al. |
| 2014/0346650 A1 | 11/2014 | Raisanen et al. |
| 2014/0349033 A1 | 11/2014 | Nonaka et al. |
| 2014/0363980 A1 | 12/2014 | Kawamata et al. |
| 2014/0367043 A1 | 12/2014 | Bishara et al. |
| 2015/0004316 A1 | 1/2015 | Thompson et al. |
| 2015/0004317 A1 | 1/2015 | Dussarrat et al. |
| 2015/0007770 A1 | 1/2015 | Chandrasekharan et al. |
| 2015/0014632 A1 | 1/2015 | Kim et al. |
| 2015/0024609 A1 | 1/2015 | Milligan et al. |
| 2015/0048485 A1 | 2/2015 | Tolle |
| 2015/0078874 A1 | 3/2015 | Sansoni |
| 2015/0086316 A1 | 3/2015 | Greenberg |
| 2015/0091057 A1 | 4/2015 | Xie et al. |
| 2015/0096973 A1 | 4/2015 | Dunn et al. |
| 2015/0099072 A1 | 4/2015 | Takamure et al. |
| 2015/0132212 A1 | 5/2015 | Winkler et al. |
| 2015/0140210 A1 | 5/2015 | Jung et al. |
| 2015/0147483 A1 | 5/2015 | Fukazawa |
| 2015/0147877 A1 | 5/2015 | Jung |
| 2015/0167159 A1 | 6/2015 | Halpin et al. |
| 2015/0170954 A1 | 6/2015 | Agarwal |
| 2015/0174768 A1 | 6/2015 | Rodnick |
| 2015/0184291 A1 | 7/2015 | Alokozai et al. |
| 2015/0187568 A1 | 7/2015 | Pettinger et al. |
| 2015/0217456 A1 | 8/2015 | Tsuji et al. |
| 2015/0240359 A1 | 8/2015 | Jdira et al. |
| 2015/0267295 A1 | 9/2015 | Hill et al. |
| 2015/0267297 A1 | 9/2015 | Shiba |
| 2015/0267299 A1 | 9/2015 | Hawkins |
| 2015/0267301 A1 | 9/2015 | Hill et al. |
| 2015/0284848 A1 | 10/2015 | Nakano et al. |
| 2015/0287626 A1 | 10/2015 | Arai |
| 2015/0308586 A1 | 10/2015 | Shugrue et al. |
| 2015/0315704 A1 | 11/2015 | Nakano et al. |

FOREIGN PATENT DOCUMENTS

| | | |
|---|---|---|
| CN | 101522943 | 9/2009 |
| CN | 101423937 | 9/2011 |
| EP | 2036600 | 3/2009 |
| EP | 2426233 | 7/2012 |
| JP | 03-044472 | 2/1991 |
| JP | 04115531 | 4/1992 |
| JP | 07-034936 | 8/1995 |
| JP | 7-272694 | 10/1995 |
| JP | 07283149 | 10/1995 |
| JP | 08-181135 | 7/1996 |
| JP | 08335558 | 12/1996 |
| JP | 10-064696 | 3/1998 |
| JP | 10-0261620 | 9/1998 |
| JP | 2845163 | 1/1999 |
| JP | 2001342570 | 12/2001 |
| JP | 2004014952 | 1/2004 |
| JP | 2004091848 | 3/2004 |
| JP | 2004134553 | 4/2004 |
| JP | 2004294638 | 10/2004 |
| JP | 2004310019 | 11/2004 |
| JP | 2004538374 | 12/2004 |
| JP | 2005507030 | 3/2005 |
| JP | 2006186271 | 7/2006 |
| JP | 3140111 | 3/2008 |
| JP | 2008060304 | 3/2008 |
| JP | 2008527748 | 7/2008 |
| JP | 2008202107 | 9/2008 |
| JP | 2009016815 | 1/2009 |
| JP | 2009099938 | 5/2009 |
| JP | 2010097834 | 4/2010 |
| JP | 2010205967 | 9/2010 |
| JP | 2010251444 | 10/2010 |
| JP | 2012089837 | 5/2012 |
| TW | 1226380 | 1/2005 |
| TW | 200701301 | 1/2007 |
| WO | 9832893 | 7/1998 |
| WO | 2004010467 | 1/2004 |
| WO | 2006054854 | 5/2006 |
| WO | 2006/056091 | 6/2006 |
| WO | 2006/078666 | 7/2006 |
| WO | 2006080782 | 8/2006 |
| WO | 2006101857 | 9/2006 |
| WO | 2007140376 | 12/2007 |
| WO | 2010039363 | 4/2010 |

OTHER PUBLICATIONS

USPTO; Office Action dated Feb. 15, 2011 in U.S. Appl. No. 12/118,596.

USPTO; Notice of Allowance dated Aug. 4, 2011 in U.S. Appl. No. 12/118,596.

USPTO; Notice of Allowance dated Jun. 16, 2011 in U.S. Appl. No. 12/430,751.

USPTO; Notice of Allowance dated Jul. 27, 2011 in U.S. Appl. No. 12/430,751.

USPTO; Restriction Requirement dated Jan. 15, 2013 in U.S. Appl. No. 12/754,223.

USPTO; Office Action dated Feb. 26, 2013 in U.S. Appl. No. 12/754,223.

USPTO; Final Office Action dated Jun. 28, 2013 in U.S. Appl. No. 12/754,223.

USPTO; Office Action dated Feb. 25, 2014 in U.S. Appl. No. 12/754,223.

USPTO; Office Action dated Apr. 23, 2013 in U.S. Appl. No. 12/763,037.

USPTO; Final Office Action dated Oct. 21, 2013 in U.S. Appl. No. 12/763,037.

USPTO; Restriction Requirement dated Sep. 25, 2012 in U.S. Appl. No. 12/854,818.

USPTO; Office Action dated Dec. 6, 2012 in U.S. Appl. No. 12/854,818.

USPTO; Final Office Action dated Mar. 13, 2013 in U.S. Appl. No. 12/854,818.

USPTO; Office Action dated Aug. 30, 2013 in U.S. Appl. No. 12/854,818.

USPTO; Final Office Action dated Mar. 26, 2014 in U.S. Appl. No. 12/854,818.

USPTO; Restriction Requirement dated May 8, 2013 in U.S. Appl. No. 13/102,980.

USPTO; Office Action dated Oct. 7, 2013 in U.S. Appl. No. 13/102,980.

USPTO; Final Office Action dated Mar. 25, 2014 in U.S. Appl. No. 13/102,980.

(56) References Cited

OTHER PUBLICATIONS

USPTO; Restriction Requirement dated Dec. 16, 2013 in U.S. Appl. No. 13/284,642.
USPTO; Restriction Requirement dated Apr. 21, 2014 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Serial No. 201080015699.9.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Jan. 25, 2014 in Serial No. 2012-504786.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem. Phys. 68(5), Mar. 1, 1978 p. 2337-2351.
USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTa1-xN Alloys of Rocksalt Structure. Journal of Applied Physics, 110, pp. 043535-1-043535-6, (2011).
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.

(56) References Cited

OTHER PUBLICATIONS

USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Japanese Patent Office; Office Action dated Dec. 1, 2014 in Application No. 2012-504786.
Taiwan Patent Office; Office Action dated Dec. 30, 2014 in Application No. 099114330.
Taiwan Patent Office; Office Action dated Dec. 19, 2014 in Application No. 099127063.
USPTO; Final Office Action dated Apr. 15, 2015 in U.S. Appl. No. 13/187,300.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Final Office Action dated Mar. 13, 2015 in U.S. Appl. No. 13/597,043.
USPTO; Final Office Action dated Jun. 1, 2015 in U.S. Appl. No. 13/597,108.
USPTO; Non-Final Office Action dated May 28, 2015 in U.S. Appl. No. 13/651,144.
USPTO; Non-Final Office Action dated Apr. 3, 2015 in U.S. Appl. No. 13/677,133.
USPTO; Final Office Action dated Mar. 25, 2015 in U.S. Appl. No. 13/791,246.
USPTO; Notice of Allowance dated Mar. 10, 2015 in U.S. Appl. No. 13/874,708.
USPTO; Restriction Requirement dated Apr. 30, 2015 in U.S. Appl. No. 13/941,216.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
USPTO; Non-Final Office Action dated Mar. 16, 2015 in U.S. Appl. No. 14/183,187.
USPTO; Non-Final Office Action dated Mar. 16, 2015 in U.S. Appl. No. 29/447,298.
Bearzotti, et al., "Fast Humidity Response of a Metal Halide-Doped Novel Polymer," Sensors and Actuators B, 7, pp. 451-454, (1992).
Crowell, "Chemical methods of thin film deposition: Chemical vapor deposition, atomic layer deposition, and related technologies," Journal of Vacuum Science & Technology A 21.5, (2003): S88-S95.
Varma, et al., "Effect of Mtal Halides on Thermal, Mechanical, and Electrical Properties of Polypyromelitimide Films," Journal of Applied Polymer Science, vol. 32, pp. 3987-4000, (1986).
USPTO; Notice of Allowance dated Aug. 4, 2015 in U.S. Appl. No. 13/677,133.
USPTO; Notice of Allowance dated Jul. 6, 2015 in U.S. Appl. No. 29/447,298.
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Non-Final Office Action dated Sep. 6, 2011 in U.S. Appl. No. 12/553,759.
USPTO; Notice of Allowance dated Jan. 24, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Notice of Allowance dated Apr. 12, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Final Office Action dated Aug. 12, 2015 in U.S. Appl. No. 12/754,223.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Notice of Allowance dated Jan. 16, 2014 in U.S. Appl. No. 12/847,848.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.

(56) References Cited

OTHER PUBLICATIONS

USPTO; Non-Final Office Action dated Dec. 7, 2012 in U.S. Appl. No. 12/953,870.
USPTO; Final Office Action dated Apr. 22, 2013 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Notice of Allowance dated Sep. 13, 2012 in U.S. Appl. No. 13/085,968.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Non-Final Office Action dated Oct. 27, 2014 in U.S. Appl. No. 13/169,951.
USPTO; Final Office Action dated May 26, 2015 in U.S. Appl. No. 13/169,591.
USPTO; Non-Final Office Action dated Sep. 1, 2015 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Non-Final Office Action dated Aug. 10, 2015 in U.S. Appl. No. 13/184,351.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Jun. 17, 2015 in U.S. Appl. No. 13/283,408.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Notice of Allowance dated Oct. 6, 2015 in U.S. Appl. No. 13/411,271.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Notice of Allowance dated May 29, 2014 in U.S. Appl. No. 13/550,419.
USPTO; Notice of Allowance dated Jun. 12, 2015 in U.S. Appl. No. 13/563,066.
USPTO; Notice of Allowance dated Jul. 16, 2015 in U.S. Appl. No. 13/563,066.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Notice of Allowance dated Aug. 28, 2015 in U.S. Appl. No. 13/597,043.
USPTO; Non-Final Office Action dated Dec. 8, 2015 in U.S. Appl. No. 13/597,108.
USPTO; Notice of Allowance dated Mar. 27, 2014 in U.S. Appl. No. 13/604,498.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.

(56) References Cited

OTHER PUBLICATIONS

USPTO; Non-Final Office Action dated Dec. 16, 2014 in U.S. Appl. No. 13/646/,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Nov. 19, 2015 in U.S. Appl. No. 13/651,144.
USPTO; Non-Final Office Action dated Nov. 19, 2015 in U.S. Appl. No. 14/659,437.
USPTO; Non-Final Office Action dated Jun. 18, 2015 in U.S. Appl. No. 13/665,366.
USPTO; Notice of Allowance dated Aug. 24, 2015 in U.S. Appl. No. 13/677,133.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance Mar. 13, 2015 dated in U.S. Appl. No. 13/749,878.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Non-Final Office Action dated Oct. 26, 2015 in U.S. Appl. No. 13/791,246.
USPTO; Non-Final Office Action dated Nov. 6, 2015 in U.S Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Non-Final Office Action dated Jul. 8, 2015 in U.S. Appl. No. 13/901,400.
USPTO; Notice of Allowance dated Aug. 5, 2015 in U.S. Appl. No. 13/901,372.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO ; Notice of Allowance dated Mar. 17, 2015 in U.S. Appl. No. 13/923,197.
USPTO; Non-Final Office Action dated Jul. 30, 2015 in U.S. Appl. No. 13/941,216.
USPTO; Non-Final Office Action dated Jun. 29, 2015 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Final Office Action dated Sep. 14, 2015 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Notice of Allowance dated Sep. 11, 2015 in U.S. Appl. No. 14/040,196.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Non-Final Office Action dated Oct. 7, 2015 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Sep. 9, 2015 in U.S. Appl. No. 14/090,750.
USPTO; Final Office Action dated Sep. 1, 2015 in U.S. Appl. No. 14/079,302.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Final Office Action dated Jul. 10, 2015 in U.S. Appl. No. 14/183,187.
USPTO; Non-Final Office Action dated Oct. 8, 2015 in U.S. Appl. No. 14/218,374.
USPTO; Non-Final Office Action dated Sep. 22, 2015 in U.S. Appl. No. 14/219,839.
USPTO; Non-Final Office Action dated Nov. 25, 2015 in U.S Appl. No. 14/219,879.
USPTO; Non-Final Office Action dated Sep. 18, 2015 in U.S. Appl. No. 14/244,689.
USPTO; Non-Final Office Action dated Nov. 20, 2015 in U.S. Appl. No. 14/260,701.
USPTO; Non-Final Office Action dated Aug. 19, 2015 in U.S. Appl. No. 14/268,348.
USPTO; Non-Final Office Action dated Oct. 20, 2015 in U.S. Appl. No. 14/281,477.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Final Office Action dated Jul. 16, 2015 in U.S. Appl. No. 14/563,044.
USPTO; Notice of Allowance dated Dec. 2, 2015 in U.S. Appl. No. 14/563,044.
USPTO; Non-Final Office Action dated Oct. 1, 2015 in U.S. Appl. No. 14/571,126.
USPTO; Notice of Allowance dated Nov. 26, 2014 in U.S. Appl. No. 29/481,301.

(56) References Cited

OTHER PUBLICATIONS

USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
Bhatnagar et al., "Copper Interconnect Advances to Meet Moore's Law Milestones," Solid State Technology, 52, 10 (2009).
Buriak, "Organometallic Chemistry on Silicon and Germanium Surfaces," Chemical Reviews, 102, 5 (2002).
Cant et al., "Chemisorption Sites on Porous Silica Glass and on Mixed-Oxide Catalysis," Can. J. Chem. 46, 1373 (1968).
Chen et al., "A Self-Aligned Airgap Interconnect Scheme," IEEE International Interconnect Technology Conference, vol. 1-3, 146-148 (2009).
Choi et al., "Improvement of Silicon Direct Bonding using Surfaces Activated by Hydrogen Plasma Treatement," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) P114-P116 (2013).
Cui et al., "Impact of Reductive N2/H2 Plasma on Porous Low-Dielectric Constant SiCOH Thin Films," Journal of Applied Physics 97, 113302, 1-8 (2005).
Dingemans et al., "Comparison Between Aluminum Oxide Surface Passivation Films Deposited with Thermal Aid," Plasma Aid and Pecvd, 35th IEEE PVCS, Jun. (2010).
Drummond et al., "Hydrophobic Radiofrequency Plasma-Deposited Polymer Films: Dielectric Properties and Surface Forces," Colloids and Surfaces A, 129-130, 117-129 (2006).
Easley et al., "Thermal Isolation of Microchip Reaction Chambers for Rapid Non-Contact DNA Amplification," J. Micromech. Microeng. 17, 1758-1766 (2007).
Ge et al., "Carbon Nanotube-Based Synthetic Gecko Tapes," Department of Polymer Science, PNAS, 10792-10795 (2007).
George et al., "Atomic Layer Deposition: An Overview," Chem. Rev. 110, 111-131 (2010).
Grill et al., "The Effect of Plasma. Chemistry on the Damage Induced Porous SiCOH Dielectrics," IBM Research Division, RC23683 (W0508-008), Materials Science, 1-19 (2005).
Heo et al., "Structural Characterization of Nanoporous Low-Dielectric Constant SiCOH Films Using Organosilane Precursors," NSTI-Nanotech, vol. 4, 122-123 (2007).
Jung et al., "Double Patterning of Contact Array with Carbon Polymer," Proc. Of SPIE, 6924, 69240C, 1-10 (2008).
Katamreddy et al., "ALD and Characterization of Aluminum Oxide Deposited on Si(100) using Tris(diethylamino) Aluminum and Water Vapor," Journal of the Electrochemical Society, 153 (10) C701-C706(2006).
Kim et al., "Passivation Effect on Low-k S/OC Dielectrics by H2 Plasma Treatment," Journal of the Korean Physical Society, 40, 1, 94-98 (2002).
Kim et al., "Characteristics of Low Temperaure High Quality Silicon Oxide by Plasma Enhanced Atomic Layer Deposition with In-Situ Plasma Densification Process," The Electrochemical Society, ECS Transactions, College of Information and Communication Engineerign. Sunakvunkwan University, 53(1).
King, Plasma Enhanced Atomic Layer Deposition of SiNx: H and SiO2, J. Vac. Sci. Technol., A29(4) (2011).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).
Kurosawa et al., "Synthesis and Characterization of Plasma-Polymerized Hexamethyldisiloxane Films," Thin Solid Films, 506-507, 176-179 (2006).
Lieberman, et al., "Principles of Plasma Discharges and Materials Processing," Second Edition, 368-381.
Lim et al., "Low-Temperature Growth of SiO2 Films by Plasma-Enhanced Atomic Layer Deposition," ETRI Journal, 27 (1), 118-121 (2005).
Liu et al., "Research, Design, and Experimen of End Effector for Wafer Transfer Robot," Industrial Robot: An International Journal, 79-91 (2012).
Mackus et al., "Optical Emission Spectroscopy as a Tool for Studying Optimizing, and Monitoring Plasma-Assisted Atomic Layer Deposition Processes," Journal of Vacuum Science and Technology, 77-87 (2010).
Maeno, "Gecko Tape Using Carbon Nanotubes," Nitto Denko Gihou, 47, 48-51.
Marsik et al., "Effect of Ultraviolet Curing Wavelength on Low-k Dielectric Material Proerties and Plasma Damage Resistance," Sciencedirect.com, 519, 11, 3619-3626 (2011).
Morishige et al., "Thermal Desorption and Infrared Studies of Ammonia Amines and Pyridines Chemisorbed on Chromic Oxide," J.Chem. Soc., Faraday Trans. 1, 78, 2947-2957 (1982).
Mukai et al., "A Study of CD Budget in Spacer Patterning Technology," Proc. Of SPIE, 6924, 1-8 (2008).
Nogueira et al., "Production of Highly Hydrophobic Films Using Low Frequency and High Density Plasma," Revista Brasileira de Aplicacoes de Vacuo, 25(1), 45-53 (2006).
Schmatz et al., "Unusual Isomerization Reactions in 1.3-Diaza-2-Silcyclopentanes," Organometallics, 23, 1180-1182 (2004).
Scientific and Technical Information Center EIC 2800 Search Report dated Feb. 16, 2012.
Sham Ma et al., "PDL Oxide Enabled Doubling," Proc. Of SPIE, 6924, 69240D, 1-10 (2008).
Wirths, et al, "SiGeSn Growth tudies Using Reduced Pressure Chemical Vapor Deposition Towards Optoeleconic Applications," This Soid Films, 557, 183-187 (2014).
Yun et al., "Behavior of Various Organosilicon Molecules in PECVD Processes for Hydrocarbon-Doped Silicon Oxide Films," Solid State Phenomena, vol. 124-126, 347-350 (2007).

* cited by examiner

US 9,324,811 B2

STRUCTURES AND DEVICES INCLUDING A TENSILE-STRESSED SILICON ARSENIC LAYER AND METHODS OF FORMING SAME

CROSS REFERENCE TO RELATED APPLICATION

This application claims the benefit and priority of Provisional Application No. 61/705,932, filed on Sep. 26, 2012, entitled TENSILE STRESSED SILICON-ARSENIC ALLOYS, the contents of which are hereby incorporated by reference to the extent the contents do not conflict with the present disclosure.

FIELD OF INVENTION

The present disclosure generally relates to semiconductor structures and devices and to methods of forming the structures and devices. More particularly, the disclosure relates to structures and devices that include a silicon arsenic layer and to methods of forming the structures and devices.

BACKGROUND OF THE DISCLOSURE

Semiconductor devices may include a tensile-stressed layer for a variety of reasons. For example, metal oxide semiconductor (MOS) devices may include a tensile-stressed layer, which forms part of a channel region of the devices. The tensile-stressed layer may exhibit higher carrier mobility—compared to a similar, non-stressed layer. As a result, devices formed with, for example, a tensile-stressed channel layer or region may exhibit faster switching speeds, better performance, and/or lower power consumption.

Many semiconductor devices use silicon as a semiconducting material for a channel region within MOS devices. In these cases, a tensile stress in the silicon (e.g., a silicon layer) may be created by doping a silicon layer with carbon atoms, which are smaller and have a smaller lattice constant than silicon atoms. Because the carbon atoms are smaller than silicon atoms, when the carbon atoms form part of the substantially silicon crystal lattice, the crystal lattice becomes tensile stressed.

Although doping silicon with carbon can create a tensile stress within a silicon lattice, adding carbon to the silicon lattice may reduce mobility of a carrier within the lattice structure (e.g., a channel region of a device). To compensate for the lower carrier mobility, the silicon may be doped with additional material, such as n-type dopants (e.g., phosphorous, arsenic, or antimony). While, this approach may provide a tensile-stressed silicon region, use of carbon doping may require additional processing steps, materials, and equipment to form a suitable tensile-stressed region or layer having desired carrier mobility. Accordingly, improved methods of forming tensile-stressed silicon regions or layers and structures and devices including the regions or layers are desired.

SUMMARY OF THE DISCLOSURE

Various embodiments of the present disclosure relate to structures and devices including a tensile-stressed silicon region or layer and to methods of forming the structures and devices. While the ways in which various embodiments of the disclosure address the drawbacks of the prior art structures, devices, and methods are discussed in more detail below, in general, the present disclosure provides methods of forming a tensile-stressed silicon layer using an n-type silicon dopant, arsenic, and structures and devices including arsenic-doped silicon tensile-stress layers or regions. As set forth in greater detail below, because arsenic acts as an electron donor, desired tensile stress within a silicon layer or region may be obtained without requiring additional processing and/or equipment, as may be used or required when, for example, carbon is used to create a tensile stress in a silicon layer or region.

In accordance with exemplary embodiments of the disclosure, a structure, also referred to herein as a film stack, includes a silicon layer (e.g., part of a substrate) and a tensile-stressed silicon arsenic layer (e.g., a silicon arsenic alloy) adjacent the silicon layer, wherein a concentration of arsenic in the silicon arsenic layer is greater than 5E+20 arsenic atoms per cubic centimeter. In accordance with various aspects of these embodiments, the concentration of arsenic in the layer ranges from greater than 5E+20 to about 1E+22 or more. In accordance with further aspects, the concentration of arsenic in the layer is greater than or equal to 1E+21, greater than or equal to 5E+21 arsenic atoms per cubic centimeter, or greater than or equal to about 1E+22 arsenic atoms per cubic centimeter. The relatively high level of arsenic doping may provide enough stress in the tensile-stressed silicon arsenic layer, such that additional dopants, such as carbon are not required to obtain a desired amount of stress in the layer to, for example, obtain desired device properties. In accordance with further aspects, the tensile-stressed silicon arsenic layer is epitaxially grown, using, for example, chemical vapor deposition (CVD) techniques, such as low pressure CVD (LPCVD), ultra-high vacuum CVD (UHV-CVD), or remote plasma CVD (RPCVD). In accordance with further aspects, the structure may include a plurality of tensile-stressed silicon arsenic layers. Structures in accordance with these embodiments can be used to form metal oxide semiconductor (MOS) devices, such as n-channel MOS (NMOS) and complimentary MOS (CMOS) devices, or for a diffusion layer, such as, for example for use in the manufacture of a finFET device.

In accordance with additional embodiments of the disclosure, a method of forming a tensile-stressed silicon arsenic layer includes the steps of supporting a substrate comprising silicon in a reactor, wherein a surface of the substrate is exposed to a reaction region within the reactor, supplying a silicon source to the reactor, supplying an arsenic source to the reactor, and forming the tensile-stressed silicon arsenic layer having a concentration of arsenic of greater than 5 E+20 arsenic atoms/cubic centimeter on the surface. In accordance with various aspects of these embodiments, a temperature of the reaction region is between about 350° C. and 700° C., about 450° C. and 700° C., or about 500° C. and 700° C. In accordance with further aspects, a pressure within the reaction region is between about 1 and about 760 Torr, or about 90 to about 300 Torr. Although mentioned as separate steps, the steps of supplying a silicon source to the reactor and supplying an arsenic source to the reactor may be performed simultaneously. In accordance with some exemplary aspects of these embodiments, during the step of supplying an arsenic source to the reactor, an arsenic source (e.g., arsine) is provided in a diluent, which may be reactive (e.g., hydrogen) or non-reactive (e.g., nitrogen, argon, helium, or the like). In accordance with yet further exemplary aspects, the tensile-stressed silicon arsenic layer is epitaxially formed overlying the surface—e.g., using chemical vapor deposition (CVD) techniques. In accordance with yet further aspects of these embodiments, the concentration of arsenic in the layer ranges from greater than 5E+20 to about 1E+22 or more. In accordance with further aspects, the concentration of arsenic in the layer is greater than or equal to 1E+21, greater than or equal to 5E+21 arsenic atoms per cubic centimeter, or greater than or equal to about 1E+22 arsenic atoms per cubic centimeter. Methods in accordance with these embodiments can be used to form structures and devices, such as the structures and devices described herein.

In accordance with additional embodiments of the disclosure, a semiconductor device, such as a MOS, NMOS, or CMOS device, includes a silicon layer and a tensile-stressed silicon arsenic layer adjacent the silicon layer. In accordance with various aspects of these embodiments, the device includes a channel including a tensile-stressed silicon arsenic region formed on the silicon layer, the tensile-stressed silicon arsenic region having a concentration of arsenic of greater than 5 E+20 arsenic atoms/cubic centimeter, a source and a drain separated from one another by the channel, and a gate configured to control current flow through the channel. The gate may suitably include a dielectric layer between the channel region and a gate electrode. In accordance with various aspects of these embodiments, the concentration of arsenic in the layer ranges from greater than 5E+20 to about 1E+22 or more. In accordance with further aspects, the concentration of arsenic in the layer is greater than or equal to 1E+21, greater than or equal to 5E+21 arsenic atoms per cubic centimeter, or greater than or equal to about 1E+22 arsenic atoms per cubic centimeter. In accordance with further aspects, the tensile-stressed silicon arsenic layer is epitaxially grown, using, for example, chemical vapor deposition (CVD) techniques. In accordance with further aspects, the structure may include a plurality of tensile-stressed silicon arsenic layers.

Both the foregoing summary and the following detailed description are exemplary and explanatory only and are not restrictive of the disclosure or the claimed invention.

BRIEF DESCRIPTION OF THE DRAWING FIGURES

A more complete understanding of the embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help to improve the understanding of illustrated embodiments of the present disclosure.

DETAILED DESCRIPTION OF EXEMPLARY EMBODIMENTS OF THE DISCLOSURE

The description of exemplary embodiments of methods, structures, and devices provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure generally relates to structures and devices that include a tensile-stressed silicon layer and to methods of forming the structures and devices. As used herein, a tensile stress refers to a stress imparted to a first material having a smaller lattice spacing relative to a lattice spacing of a second material to which the first material is bound/adhered. Because the atoms of the first material are held at a greater distance from one another by spacing of atoms in the second material than the lattice spacing of the first material, atoms in the first material experience a tensile force, e.g., a force that would tend to draw the atoms in the first material further away from one another. Without wishing to be bound by theory, inducing stress in a lattice structure may alter interatomic forces. As set forth in more detail below, when tensile-stressed materials are used in semiconductor devices (e.g., channel regions within a metal oxide semiconductor (MOS) device), carrier transport through the tensile-stressed material may be increased. For example, pulling the lattice farther apart, as in a tensile-stressed film, may ease passage of carriers through the lattice. In turn, device power consumption and switching speed may be enhanced relative to similar devices that do not include such tensile-stressed material.

Figure 10:
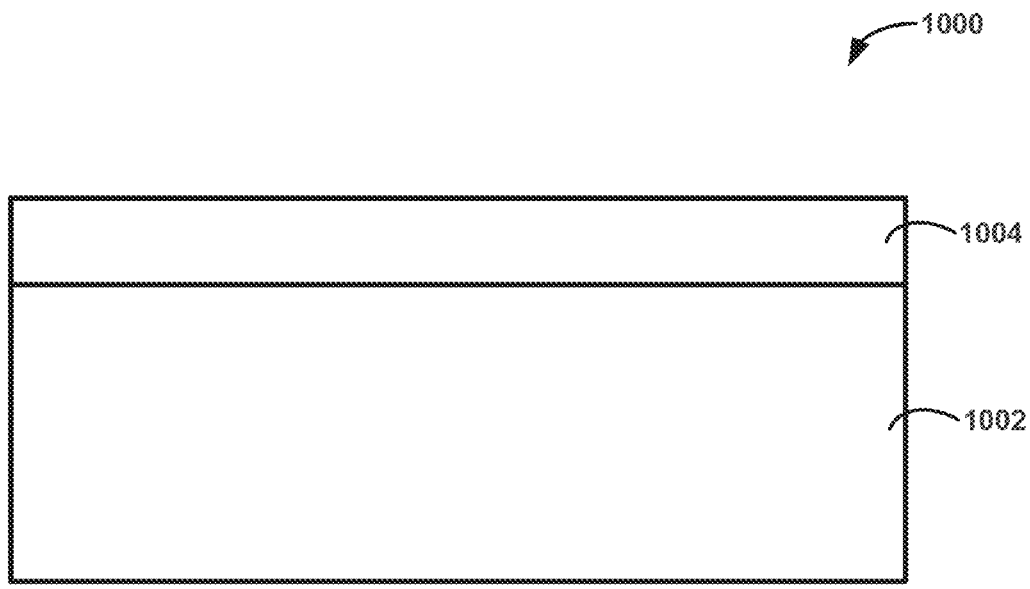
FIG. 10 illustrates a structure including a tensile-stressed silicon arsenic layer in accordance with various embodiments of the disclosure.

FIG. 10 illustrates a structure 1000, which includes a silicon layer 1002 (e.g., a portion of a substrate) and a tensile-stressed layer 1004. As used herein, a "substrate" refers to any material having a surface onto which material can be deposited. A substrate may include a bulk material such as silicon (e.g., single crystal silicon which may include dopants) or may include one or more layers overlying the bulk material. Further, the substrate may include various topologies, such as trenches, vias, lines, and the like formed within or on at least a portion of a layer of the substrate. Tensile-stressed layer 1004, in accordance with various embodiments of the disclosure, includes a silicon film or region that is doped with arsenic at a concentration of greater than 5 E+20 arsenic atoms/cubic centimeter, within an acceptable tolerance. In accordance with various aspects of these embodiments, the concentration of arsenic in the layer ranges from greater than 5E+20 to about 1E+22 or more. In accordance with further aspects, the concentration of arsenic in the layer is greater than or equal to 1E+21, greater than or equal to 5E+21 arsenic atoms per cubic centimeter, or greater than or equal to about 1E+22 arsenic atoms per cubic centimeter.

As set forth in more detail below, layer 1004 may be formed by forming an arsenic-doped silicon film by a suitable chemical vapor deposition (CVD) process, such as an epitaxial CVD process where suitable silicon and arsenic sources react to form a silicon arsenic alloy. Such films may be used for mobility enhancement in MOS devices, such as NMOS and CMOS devices—without including carbon dopants. Eliminating carbon dopants may potentially improve electrical performance and may reduce device processing time, and equipment and materials used to form devices. Layer 1004 may alternatively be used as a solid-source dopant—e.g., for formation of multigate devices, such as FinFETs.

Figure 1:
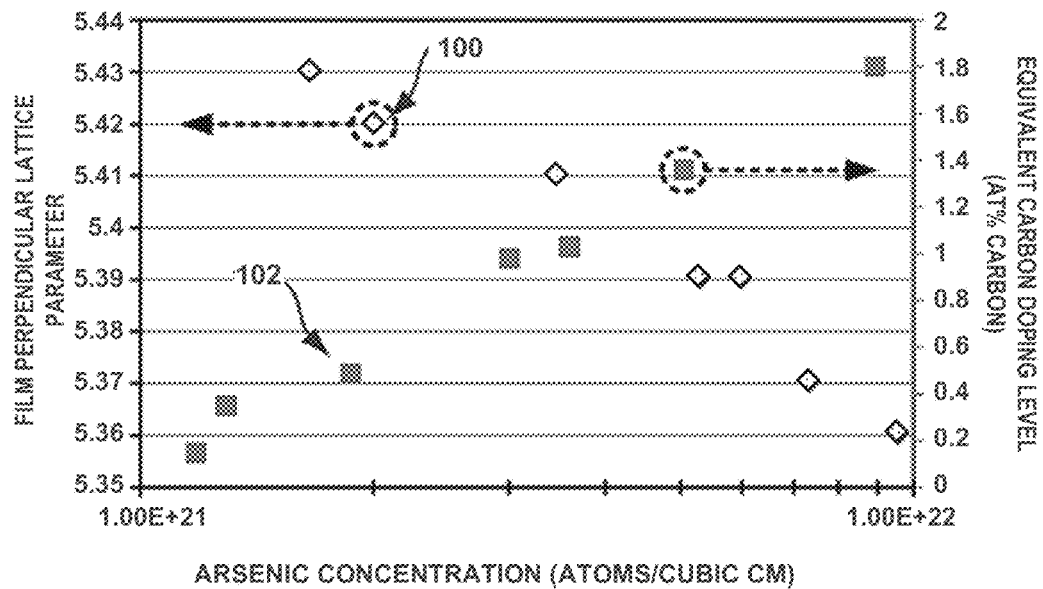
FIG. 1 illustrates a relationship between arsenic concentration and perpendicular lattice parameter, and a relationship between arsenic concentration and equivalent carbon doping level for examples of silicon arsenic alloys formed according to exemplary embodiments of the present disclosure.

FIG. 1 illustrates a relationship 100 between a perpendicular lattice parameter for examples of silicon arsenic alloys (e.g., layer 1004) formed according to various embodiments of the present disclosure and arsenic concentration for those films. As used herein, the term "alloy" means a crystalline material, wherein at least some of the lattice sites of a crystalline material are substituted with atoms from a dopant. In the case of silicon arsenic alloys, at least some arsenic atoms reside on silicon crystal lattice sites.

The data illustrated in FIG. 1 were obtained using X-ray diffraction (XRD) and secondary ion mass spectrometry (SIMS). As shown in relationship 100, as arsenic levels increase in the silicon films, the perpendicular lattice parameter becomes smaller. For example, at an arsenic concentration of approximately 1.65 E+21 arsenic atoms/cubic centimeter (approximately 3.3 atomic percent arsenic), the perpendicular lattice parameter for the silicon arsenic alloy is approximately 5.42 Å. At an arsenic concentration of approximately 9.56 E+21 arsenic atoms/cubic centimeter (approximately 19.12 atomic percent arsenic), the perpendicular lattice parameter for the silicon arsenic alloy is approximately 5.36 Å, so that the atoms are spaced 0.06 Å closer together. This decreasing trend in lattice spacing, combined with x-ray diffraction data presented herein, indicates that the silicon arsenic alloy (e.g., layer 1004) exhibits a tensile stress when present on a silicon substrate (e.g., substrate 1002) with a wider lattice parameter.

FIG. 1 also illustrates a relationship 102 between arsenic concentration and equivalent carbon doping level for exemplary silicon arsenic alloys. In other words, relationship 102 correlates arsenic concentration in the silicon arsenic alloy with an amount of carbon effective to create an equivalent tensile stress in a carbon-doped silicon film. Thus, it will be appreciated that the effective atomic percentage of carbon described herein is believed to be a proxy for an amount of arsenic that is effective to generate an equivalent film of approximately equal tensile stress.

Figure 2:
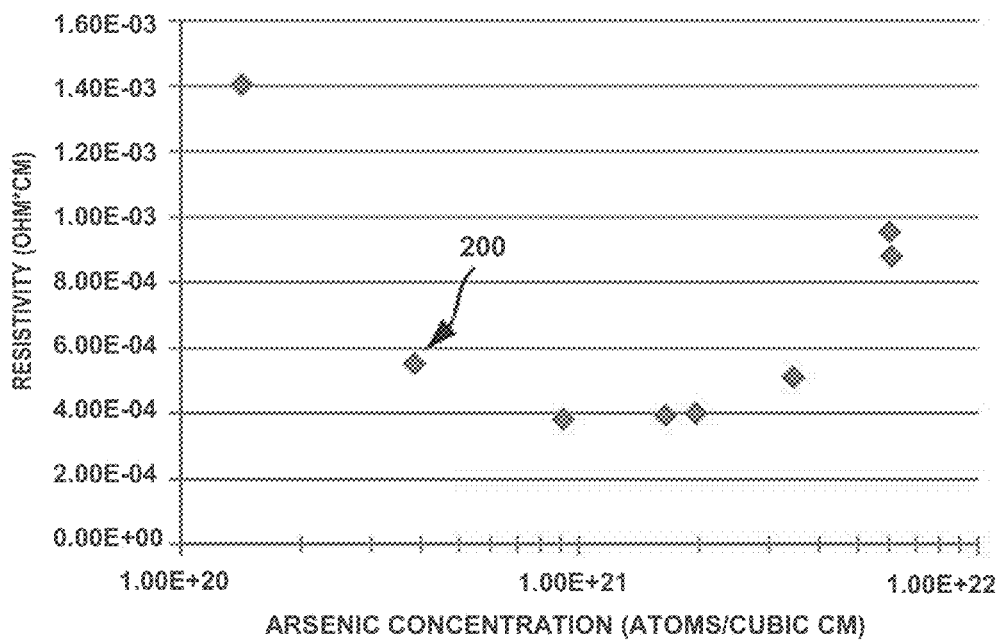
FIG. 2 illustrates a relationship between arsenic concentration and film resistivity for examples of silicon arsenic alloys formed according to exemplary embodiments of the present disclosure.

FIG. 2 illustrates a relationship 200 between arsenic concentration and film resistivity for examples of silicon arsenic alloys formed according to embodiments of the present disclosure. Initially, relationship 200 illustrates a decreasing correspondence between the arsenic concentration and the resistivity (e.g., the resistivity drops to approximately 4 E-04 Ohm*cm at an arsenic concentration of approximately 9 E+20 arsenic atoms/cubic cm).

Relationship 200 further illustrates that increasing the arsenic concentration beyond approximately 9 E+20 arsenic atoms/cubic cm causes the resistivity to increase. In some embodiments, this increase may begin at approximately 2-3 E+21 arsenic atoms/cubic cm. Without wishing to be bound by theory, this increase in resistivity may be attributable to such causes as alloy scattering and/or degradation of the crystal lattice. Though not illustrated in FIG. 2, a minimum resistivity may be reached at approximately 4 E+20 arsenic atoms/cubic cm. Further, though also not shown in FIG. 2, increasing the concentration of arsenic within the film may eventually cause the resistivity of the film to stabilize at approximately 0.3 mOhm*cm. It will be understood that deposition conditions may have an impact on resistivity, thereby allowing processes to be optimized for film performance; for example, decreasing process temperature generally decreases the resistivity of the film. This is described in more detail below with reference to FIG. 7.

Figure 3:
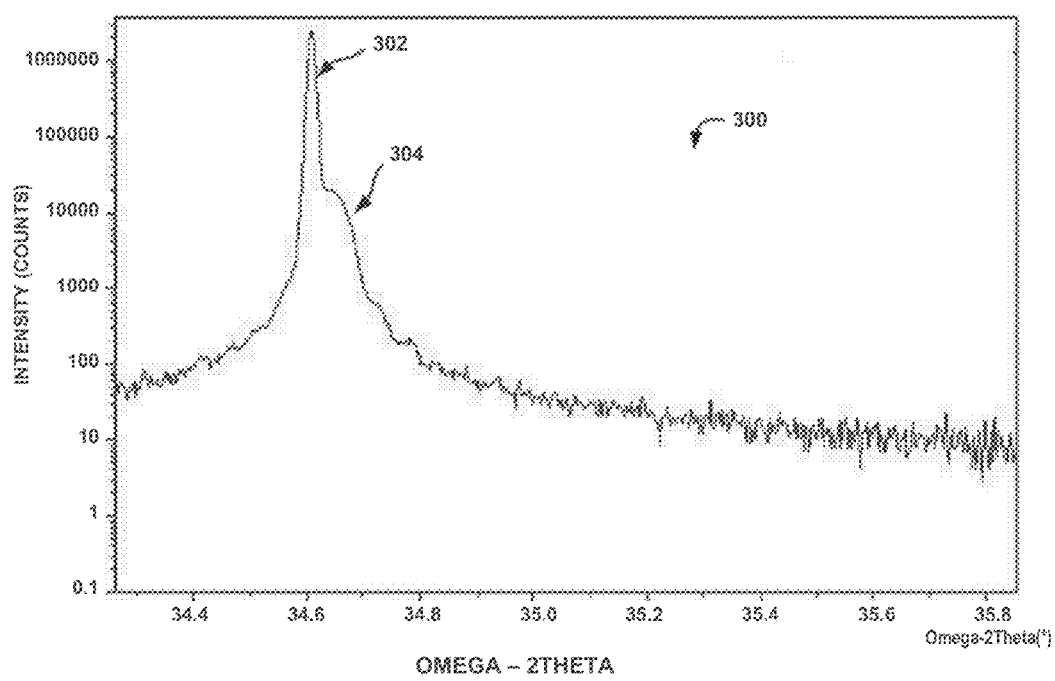
FIG. 3 illustrates an example X-ray diffraction spectrum for a silicon arsenic alloy formed according to an exemplary embodiment of the present disclosure.

FIG. 3 illustrates an example XRD spectrum 300 for a silicon arsenic alloy formed according to an embodiment of the present disclosure. The alloy shown in FIG. 3 includes approximately 1.25 E+21 arsenic atoms/cubic centimeter as measured by Rutherford backscattering spectrometry (RBS), or approximately 2.5 atomic percent arsenic. This level of arsenic doping is believed to exhibit the same level of tensile stress as a silicon film including approximately 0.15 atomic percent carbon. Spectrum 300 includes a peak 302 at approximately 34.6 omega-20 believed to be associated with the silicon substrate and a shoulder peak 304 at 34.7 omega-20 believed to be associated with the silicon arsenic alloy and to indicate tensile strain. Thus, it is believed that the arsenic can be doped into the silicon film at a level that is suitable to generate a detectable silicon arsenic alloy.

As noted above, in accordance with exemplary embodiments of the disclosure, the silicon arsenic alloys described herein may be formed using chemical vapor deposition (CVD) techniques, such as low pressure CVD (LPCVD), ultra-high vacuum CVD (UHV-CVD), or remote plasma CDV (RPCVD). In accordance with various aspects of these embodiments, a silicon arsenic alloy may be formed by epitaxially depositing the silicon arsenic alloy on a suitable substrate (e.g., a silicon layer), so that a crystalline film of silicon arsenic alloy is formed over a crystalline substrate. Epitaxially forming the alloy over a suitable substrate may provide desirable lattice registration between the alloy and the substrate, so that a tensile stress is imparted by a mismatch in lattice parameters. However, it will be appreciated that any suitable method of forming a silicon arsenic alloy having a tensile stress on a suitable substrate may be employed without departing from the scope of the present disclosure.

Figure 4:
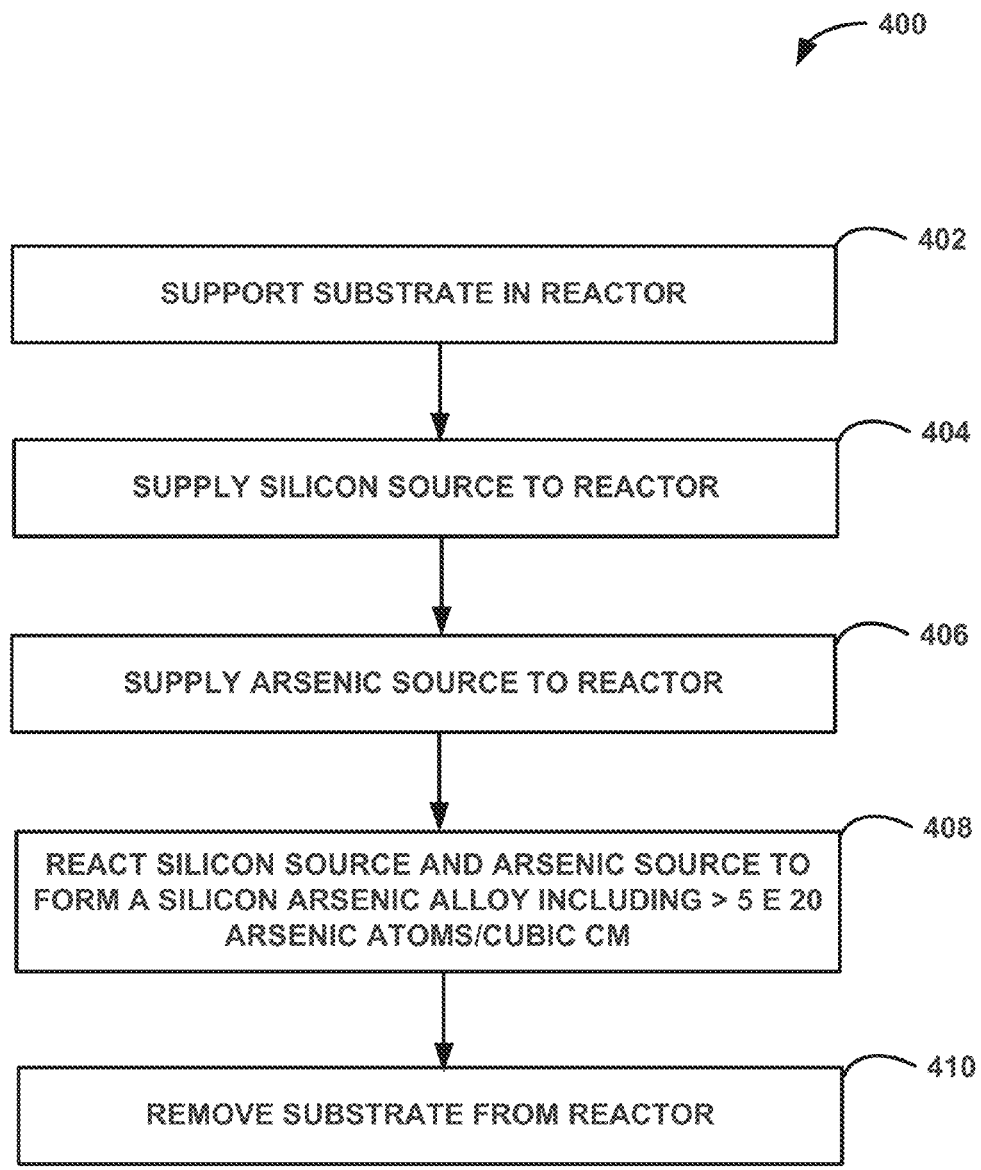
FIG. 4 illustrates a flow chart illustrating a method of forming a silicon arsenic alloy according to an exemplary embodiment of the present disclosure.

FIG. 4 illustrates a flow chart illustrating a method 400 for epitaxially depositing or forming a silicon arsenic alloy on a silicon substrate in accordance with exemplary embodiments of the disclosure. It will be appreciated that the processes illustrated in FIG. 4 and described below are provided for discussion purposes and that some processes may be omitted, re-ordered, performed simultaneously, or substituted without departing from the scope of the present disclosure.

At 402, method 400 includes supporting a substrate in a reactor. For example, the substrate may be supported so that a silicon surface, on which the silicon arsenic alloy will be formed, is exposed to a reaction region within the reactor where one or more film formation reactions may occur. In some embodiments, supporting the substrate in the reactor may include adjusting one or more reactor conditions, such as temperature, pressure, and/or carrier gas (e.g., Ar, $N_2$, $H_2$, or He) flow rate, to conditions suitable for film formation. For example, in some embodiments, a reactor temperature may be adjusted so that a reaction region formed near an exposed silicon surface of the substrate, or that the surface of the substrate itself, is within a range of 500° C.-700° C., or about 350° C.-700° C., or about 450° C.-700° C. and that the reaction region pressure is within range of about 1 to about 760 Torr or 90-300 Torr. Further, in some embodiments, carrier (e.g., nitrogen) gas may be supplied at a flow rate of approximately 10 to 40 standard liters/minute (SLM). However, it will be appreciated that in some embodiments, a different carrier/diluent gas may be employed, a different flow rate may be used, or that such gas(es) may be omitted.

At 404, method 400 includes supplying a silicon source to the reactor. Non-limiting examples of suitable silicon sources include silane ($SiH_4$), dichlorosilane ($SiH_2Cl_2$), trisilane ($Si_3H_8$), and disilane ($Si_2H_6$). A flowrate of a silicon source may vary according to the precursor sources used. For example, in some embodiments, trisilane may be supplied at between 110 and 220 mg/minute. Dichlorosilane may be supplied at, for example, between 100 and 400 sccm.

At 406, method 400 includes supplying an arsenic source to the reactor. One non-limiting example of an arsenic source includes arsine ($AsH_3$) diluted in a carrier, such as $H_2$—e.g., a one percent arsine in hydrogen source. For example, arsine may be supplied at between 10 and 2500 sccm with 20.7 slm hydrogen. A non-reactive diluent gas (e.g., nitrogen) and/or a reactive diluent gas (e.g., hydrogen) may be used to supply the arsenic source to the reactor. A non-reactive diluent gas may exhibit comparatively less substrate surface site occupation relative to reactive diluent gases. In other words, a non-reactive diluent gas may be selected in view of transport equilibrium relationships in the reaction system. However, it will be appreciated that one or more reactive diluent gases may be selected/provided in view of other reaction equilibrium relationships in the reaction system, so that concentration of arsenic active species may be managed during the film formation.

Although illustrated as separate steps, steps 404 and 406 may occur simultaneously, substantially simultaneously, and/or in reverse order.

At 408, method 400 includes reacting the silicon source and the arsenic source to form a tensile-stressed silicon arsenic alloy having an arsenic concentration of greater than 5 E+20 arsenic atoms/cubic centimeter, within an acceptable tolerance. In accordance with various aspects of these embodiments, the concentration of arsenic in the layer ranges from greater than 5E+20 to about 1E+22 or more. In accordance with further aspects, the concentration of arsenic in the layer is greater than or equal to 1E+21, greater than or equal to 5E+21 arsenic atoms per cubic centimeter, or greater than or equal to about 1E+22 arsenic atoms per cubic centimeter. For example, the silicon source and the arsenic source may react in a reaction region of the reactor so that the silicon arsenic alloy is epitaxially formed on a silicon surface of the substrate. Various reactions related to film formation may occur in the gas phase and/or on the surface. Suitable silicon active species and arsenic active species may react directly and/or via suitable intermediates to form the silicon arsenic alloy film. In some embodiments, tensile-stressed silicon arsenic films may be formed having 1.0 E+21 arsenic atoms/cubic centimeter. In some embodiments, tensile-stressed silicon arsenic films may be formed having 1.0 E+22 arsenic atoms/cubic centimeter.

Reactor conditions during steps 404-408 may be the same or similar to those described above in connection with step 402. At 410, method 400 includes removing the substrate bearing the silicon arsenic alloy film from the reactor.

Figure 5:
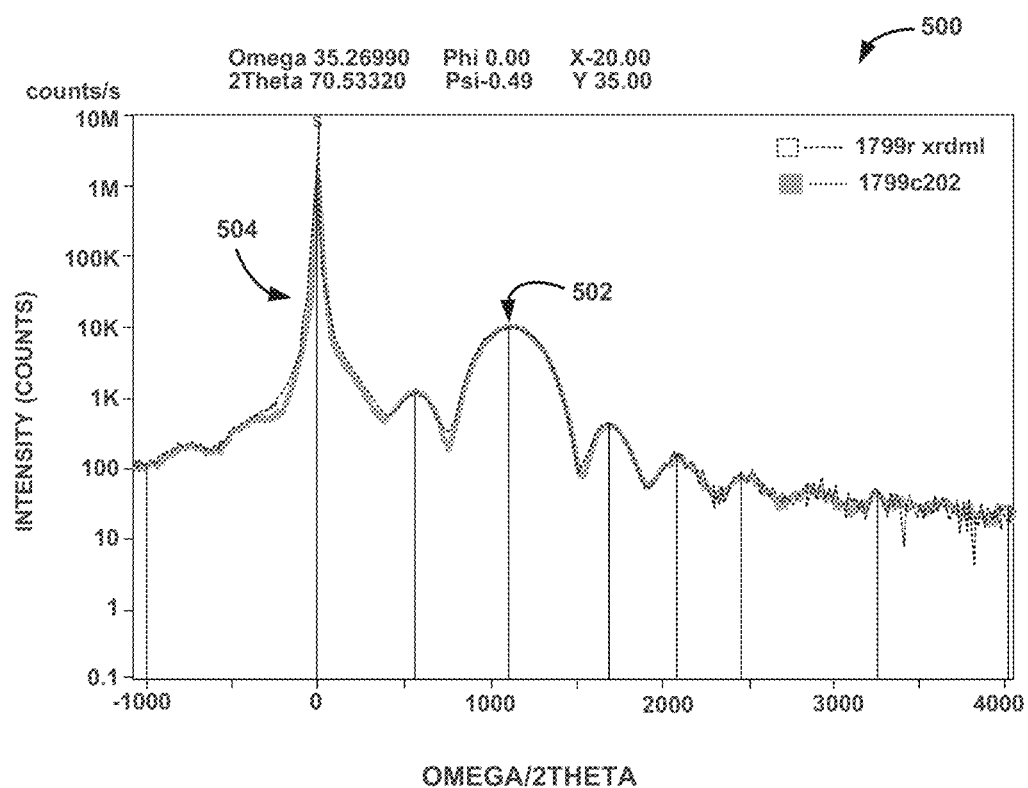
FIG. 5 illustrates an example X-ray diffraction spectrum for an exemplary silicon arsenic alloy formed on a silicon substrate according to an exemplary embodiment of the present disclosure.

Method 400 may be used to form a suitable silicon arsenic alloy on any suitable substrate so as to form an alloy having a tensile stress. FIG. 5 illustrates an XRD spectrum 500 for an exemplary silicon arsenic alloy formed according to an exemplary aspect of method 400. As shown in spectrum 500, the silicon arsenic alloy, shown at peak 502, is formed on top of a silicon substrate, shown at peak 504. The silicon arsenic alloy layer data shown in FIG. 5 was formed at 500° C. and 300 Torr using 220 mg/min of trisilane and 1500 sccm of arsine (1% arsine in hydrogen). The alloy depicted in FIG. 5 has an arsenic concentration of approximately 4.3 E+21 arsenic atoms/cubic centimeter, which is believed to be approximately equivalent to a tensile-stressed silicon film including about 1.01 atomic percent carbon. Tensile strain is evidenced by the silicon arsenic layer peak. It will be noted that the concentration of arsenic in the sample of FIG. 5 is higher than that of FIG. 3, and that the silicon arsenic layer peak of FIG. 5 is more clearly separated from the silicon substrate peak than that of FIG. 3, indicating the smaller lattice parameter for the sample with the higher arsenic concentration.

Figure 6:
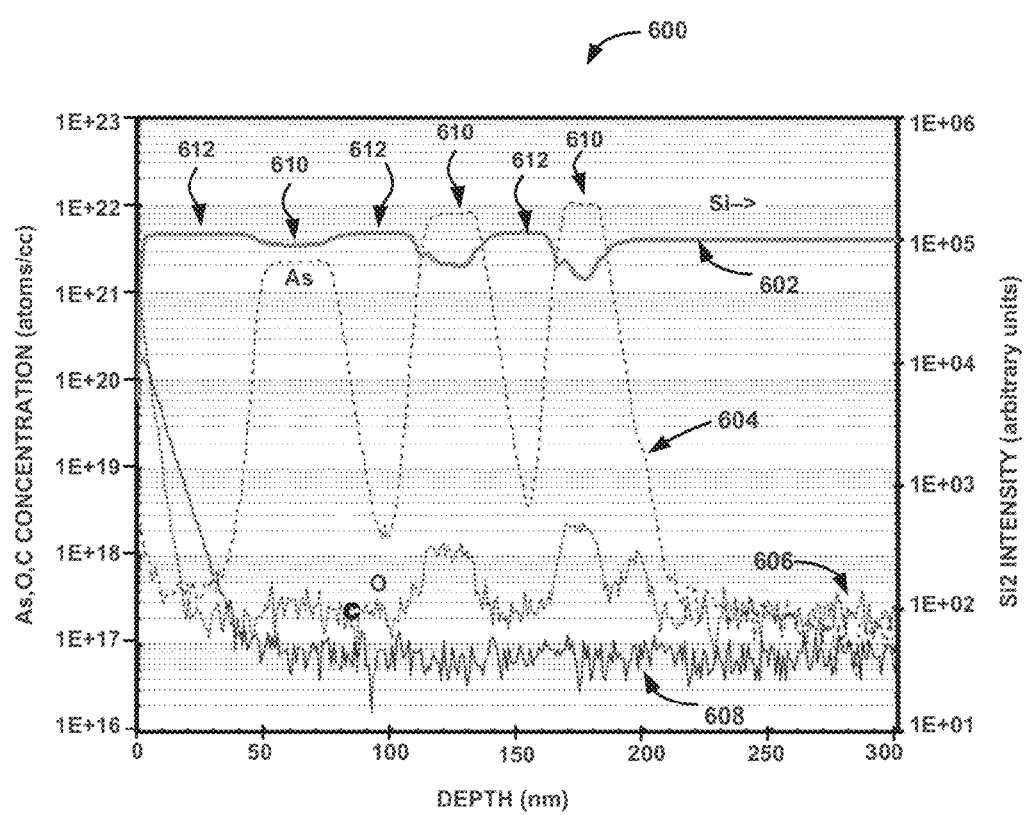
FIG. 6 illustrates a secondary ion mass spectrometry depth profile for a film stack or structure including a plurality of silicon arsenic alloy layers and a plurality of silicon layers formed according to an exemplary embodiment of the present disclosure.

In accordance with various aspects of exemplary embodiments, method 400 may be managed to deposit a plurality of silicon arsenic layers. For example, FIG. 6 illustrates a SIMS depth profile 600 illustrating an embodiment of a film stack. Depth profile 600 includes a silicon spectrum 602, an arsenic spectrum 604, an oxygen spectrum 606, and a carbon spectrum 608. Depth profile 600 illustrates three discrete silicon arsenic alloy layers, shown as layers 610, which are separated from one another and capped by silicon films, shown as layers 612. Thus, it will be appreciated that sandwich structures of silicon arsenic alloys and silicon films or any other suitable intervening film may be formed in a suitable reactor system (e.g., in-situ, without exposure to air and/or a vacuum break). If employed, such in-situ deposition techniques may avoid the formation of adventitious oxides that may alter device electrical properties.

As mentioned above, various reaction conditions may be altered to adjust properties of the silicon arsenic alloy. Such conditions may be adjusted at any suitable time before, during, or after film deposition. For example, reactor conditions may be adjusted before film deposition to prepare the substrate surface and/or reaction environment for deposition. Reactor conditions may be adjusted during film deposition to adjust one or more film properties (e.g., to alter film concentration, etc.). Reactor conditions may be adjusted after film deposition to post-treat a deposited film and/or to prepare for deposition of a subsequent layer.

Figure 7:
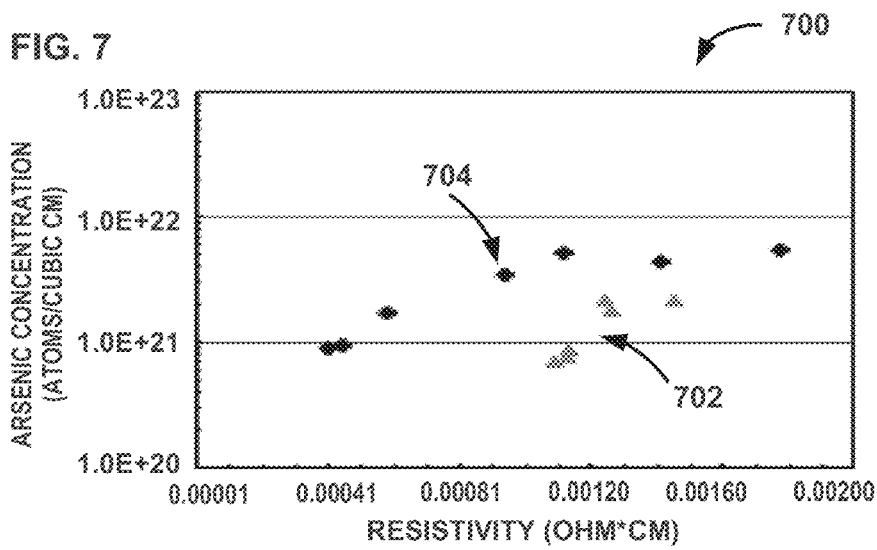
FIG. 7 illustrates a relationship between resistivity and arsenic concentration for silicon arsenic alloys formed at different temperatures according to exemplary embodiments of the present disclosure.

For example, reactor temperature may be varied to alter the resistivity of the deposited silicon arsenic alloy. FIG. 7 illustrates a comparison 700 between concentration/resistivity relationships for embodiments of silicon arsenic alloys formed at different temperatures using different silicon sources. For example, family 702 (triangles) illustrates concentration/resistivity relationships for alloys formed using trisilane at 500° C. In contrast, family 704 (diamonds) illustrates concentration/resistivity relationships for alloys formed using dichlorosilane at 700° C. Without wishing to be bound by theory, reducing the film formation temperature may help incorporate arsenic within the silicon lattice. It is believed that increased arsenic incorporation may help increase arsenic concentration within the alloy and increase tensile film stress.

Figure 8:
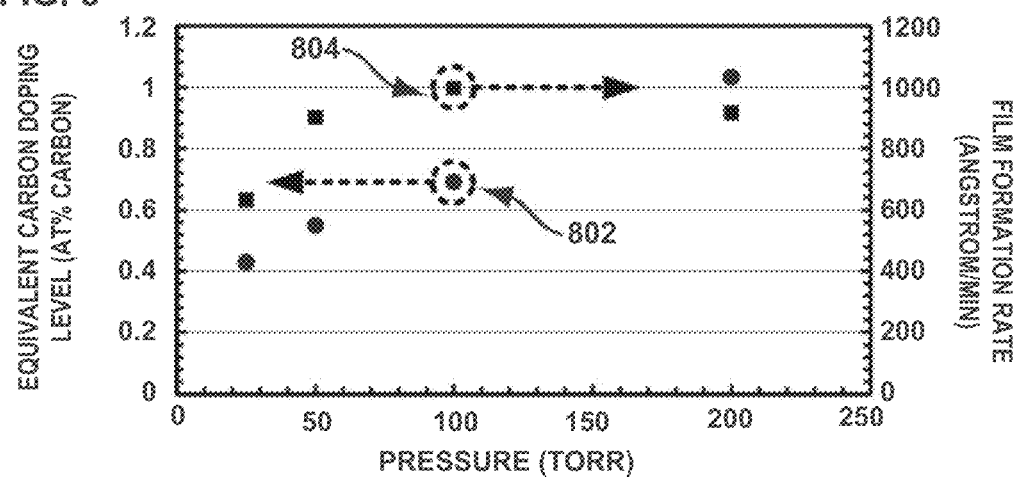
FIG. 8 illustrates a relationship between processing pressure and equivalent carbon doping level and a relationship between processing pressure and film formation rate for exemplary silicon arsenic alloys formed according to exemplary embodiments of the present disclosure.

As another example, reactor pressure may be varied to alter the stress of the deposited film and/or to vary the growth rate of the deposited film. FIG. 8 illustrates a relationship 802 (circles) between reactor pressure and equivalent carbon doping level for embodiments of silicon arsenic alloys. The films shown in FIG. 8 were deposited at the same temperature, silicon source supply conditions, and arsenic source supply conditions. As shown in relationship 802, an increase in the reactor pressure corresponds to an increase in the equivalent carbon doping level, which is believed to correspond to an increase in tensile film stress.

Relationship 804 (squares), shown in FIG. 8, correlates what is believed to be a saturating relationship between reactor pressure and film deposition rate. This may indicate a transition from a kinetically-dominated reaction regime at pressures below 100 Torr to a mass transfer-dominated reaction regime at pressures in excess of 100 Torr. Without wishing to be bound by theory, it may be that a pressure-dependent mechanism for incorporating arsenic within the lattice operates at least partially independently from the bulk film formation chemistry in some conditions based upon the apparent mechanistic differences shown in relationships 802 and 804.

Figure 9:
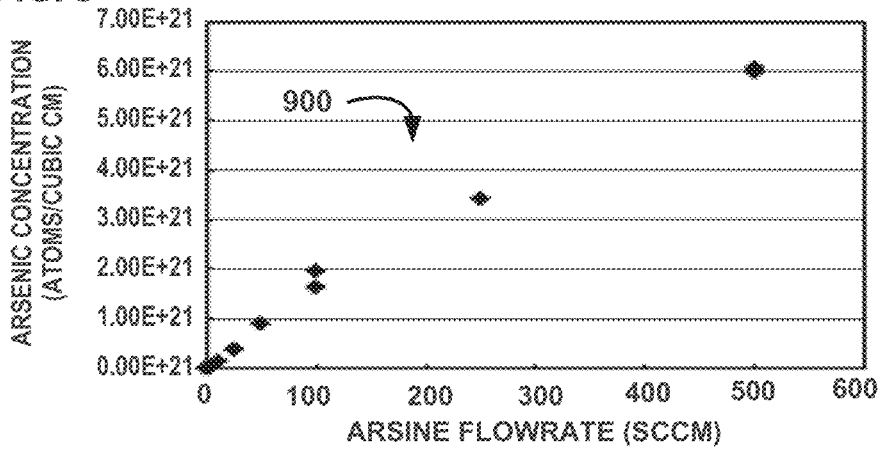
FIG. 9 illustrates a relationship between a process flow rate for an exemplary arsenic source and an arsenic concentration for silicon arsenic alloys formed according to exemplary embodiments of the present disclosure.

As yet another example, arsine flow rate, and thus reactor concentration, may be varied to adjust arsenic concentration within the silicon arsenic alloy. For example, FIG. 9 illustrates a relationship 900 between arsine flow rate and arsenic concentration for exemplary silicon arsenic alloys formed according to various embodiments of the present disclosure. Relationship 900 illustrates an approximately linear relationship between arsine flow rate and arsenic concentration within the film. It is believed that increasing the availability of arsenic during the reaction by increasing the flow rate may increase the probability that arsenic atoms may be incorporated into the lattice at given reactor conditions.

Figure 11:
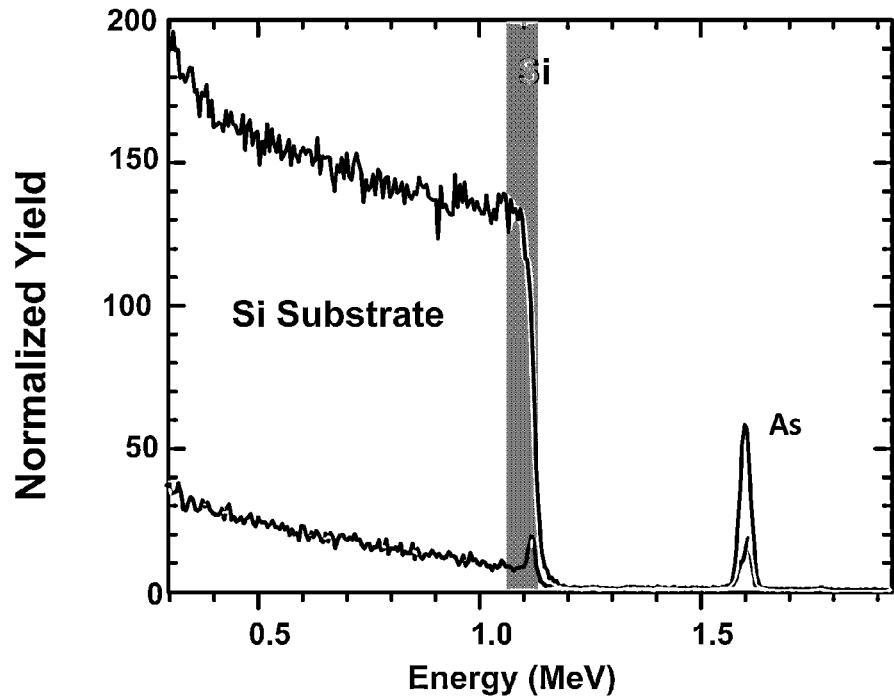
FIGS. 11-12 illustrate graphical representations of aligned and random Rutherford backscattering spectra for two example samples in accordance with exemplary embodiments of the present disclosure.
Figure 12:
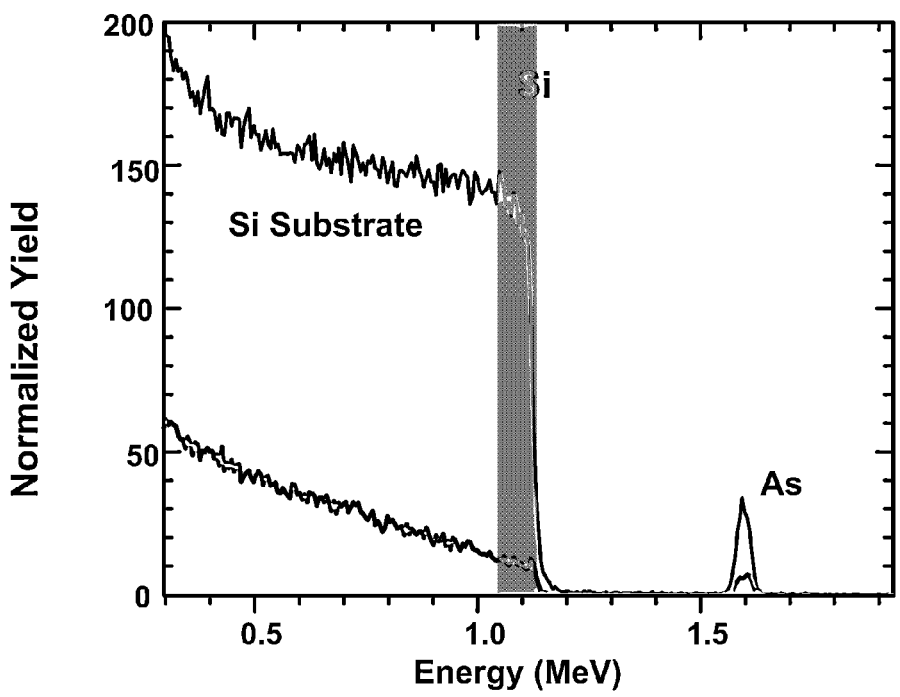

Table 1 and 2, below, are tabled of x-ray diffraction, secondary ion mass spectrometry (SIMS), and Rutherford backscattering spectrometry (RBS) data for a plurality of silicon arsenic films according to embodiments of the present disclosure. As can be seen from the x-ray diffraction data and the elemental analysis from the RBS and SIMS data, the separation ("separation degree") between the silicon and silicon arsenic alloy peaks in the x-ray diffraction pattern increases as a function of arsenic concentration in the silicon arsenic films, indicating the decrease in the lattice parameter as a function of increasing arsenic content. FIGS. 11 and 12 respectively show random (higher peaks) and aligned (lower peaks) RBS spectra for samples 1799R and 1827 of Table 1.

TABLE 1

| Run # | SIMS As at/cm^3 | Fraction | Thickness A | XRD ⊥ lattice A | Eq Carbon at % | Thickness A |
|---|---|---|---|---|---|---|
| 1799R | 5.30E+21 | 0.11 | 433 | 5.39 | 0.98 | 501 |
| 27 | 9.56E+21 | 0.19 | 304 | 5.36 | 1.8 | 85 |
| 19 | — | — | 508 | 5.38 | 1.24 | 508 |
| 4 | 1.65E+21 | 0.03 | 1098 | 5.43 | 0.148 | 1098 |
| 9 | 3.45E+21 | 0.07 | 500 | 5.41 | 0.485 | 500 |
| 10 | 6.00E+21 | 0.12 | 903 | 5.39 | 1.03 | 903 |
| 25 | 7.33E+21 | 0.15 | 889 | 5.37 | 1.359 | 889.9 |
| 1827 | 2.00E+21 | 0.04 | 700 | 5.42 | 0.35 | 700 |

TABLE 2

| Run # | RBS As Fraction | Si Fraction | Thickness at/cm^2 | Channeling Chi min | Quality | XRD Substrate Degree | Layer Degree | Separation Degree |
|---|---|---|---|---|---|---|---|---|
| 1799R | 0.09 | 0.91 | 3.00E+17 | 12 | good | 34.57054 | 34.88 | 0.312 |
| 27 | 0.2 | 0.8 | 1.70E+17 | 28 | Fair | 34.56547 | 35.13 | 0.562 |
| 19 | 0.13 | 0.87 | 2.40E+17 | 24 | Fair | 34.73577 | 35.12 | 0.384 |
| 4 | 0.025 | 0.975 | 5.00E+17 | 26 | Fair | 34.60898 | 34.65 | 0.037 |
| 9 | 0.055 | 0.945 | 2.30E+17 | 23 | Fair | 34.59358 | 34.73 | 0.133 |
| 10 | 0.115 | 0.885 | 4.00E+17 | 100 | No | 34.57999 | 34.90 | 0.321 |
| 25 | 0.13 | 0.87 | 4.00E+17 | 31 | Fair | 34.75304 | 35.18 | 0.426 |
| 1827 | 0.045 | 0.955 | 3.50E+17 | 23 | Fair | 34.702 | 34.8 | 0.098 |

Figure 13:
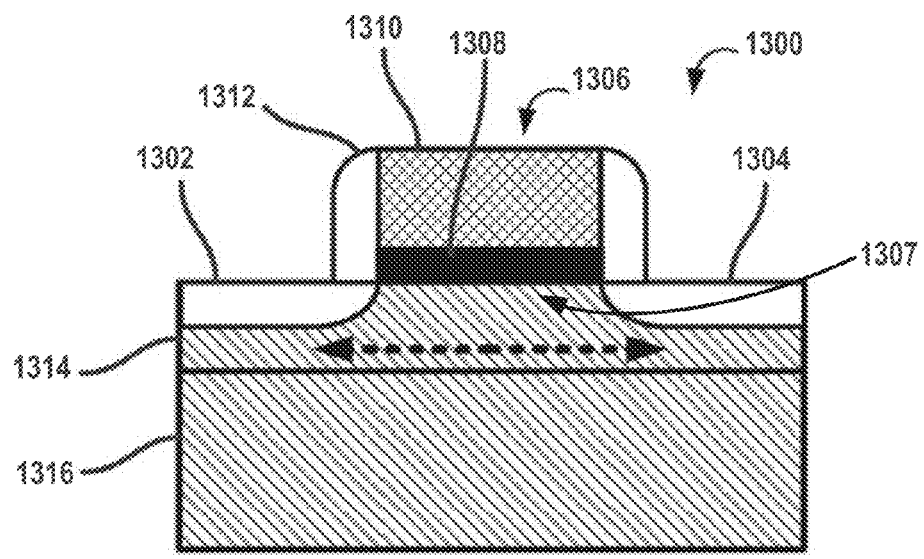
FIG. 13 illustrates an exemplary NMOS gate structure including an example tensile-stressed silicon arsenic alloy layer formed according to an exemplary embodiment of the present disclosure.

It will be appreciated that the methods described herein may be used to form one or more layers included in a semiconductor device. For example, FIG. 13 schematically illustrates a cross-section of a portion of an exemplary NMOS transistor 1300, including a source 1302, a drain 1304, and a gate 1306 that controls the flow of current in a channel region 1307 between source 1302 and drain 1304. Gate 1306 includes a gate dielectric 1308 and a gate electrode 1310. In the illustrated example, a spacer 1312 is formed on the sides of gate 1306 to mask the tips of the source and drain implants, preventing damage during contact formation.

In the example shown in FIG. 13, a silicon arsenic layer 1314 may be formed on top of a substrate layer 1316 (e.g., a silicon region including well implants). Source 1302 and drain 1304 regions may include additional doping of n- or p-type dopants. Forming the silicon arsenic alloy 1314 on top of a silicon film, other suitable film, substrate, or portions thereof, may cause silicon arsenic alloy 1314 to have a tensile stress, as indicated by the arrows shown in FIG. 13.

In accordance with additional exemplary embodiments, the silicon arsenic films are formed and the methods of forming such films described herein use a suitable semiconductor processing tool, such as cold-wall, hot-susceptor CVD reactors. An exemplary reactor system suitable for use with the present disclosure is sold by ASM under the name Intrepid™.

Figure 14:
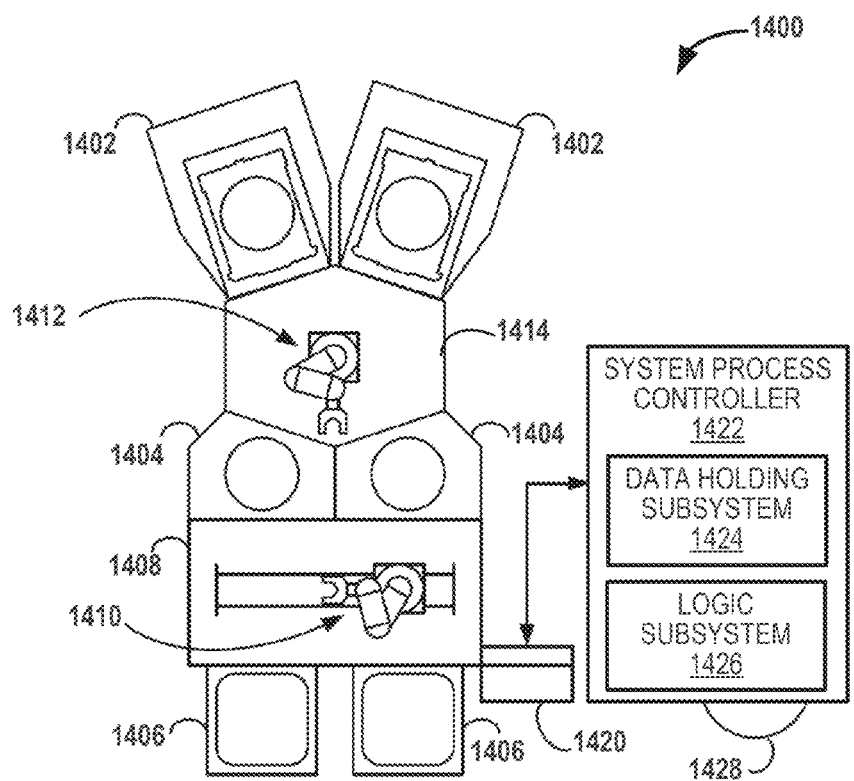
FIG. 14 illustrates an exemplary semiconductor processing tool for forming tensile-stressed silicon arsenic layers on semiconductor substrates according to exemplary embodiments of the present disclosure.

FIG. 14 schematically illustrates a top view of an exemplary semiconductor processing tool 1400, including a plurality of semiconductor processing modules 1402. While the depicted embodiment includes two modules, it will be appreciated that any suitable number of semiconductor processing modules may be provided. For example, some processing tools may include just one module while other processing tools may include more than two modules.

FIG. 14 also shows load locks 1404 for moving substrates between portions of semiconductor processing tool 1400 that exhibit ambient atmospheric pressure conditions and portions of the tool that are at pressures lower than atmospheric conditions. An atmospheric transfer module 1408, including an atmospheric substrate handling robot 1410, moves substrates between load ports 1406 and load locks 1404, where a portion of the ambient pressure is removed by a vacuum source (not shown) or is restored by backfilling with a suitable gas, depending on whether substrates are being transferred into or out of the tool. Low-pressure substrate handling robot 1412 moves substrates between load locks 1404 and semiconductor processing modules 1402 within low-pressure transfer module 1414. Substrates may also be moved among the semiconductor processing modules 1402 within low-pressure transfer module 1414 using low-pressure substrate handling robot 1412, so that sequential and/or parallel processing of substrates may be performed without exposure to air and/or without a vacuum break.

FIG. 14 also shows a user interface 1420 connected to a system process controller 1422. User interface 1420 is adapted to receive user input to system process controller 1422. User interface 1420 may optionally include a display subsystem, and suitable user input devices such as keyboards, mice, control pads, and/or touch screens, for example, that are not shown in FIG. 14.

FIG. 14 shows an embodiment of a system process controller 1422 provided for controlling semiconductor processing tool 1400. System process controller 1422 may operate process module control subsystems, such as gas control subsystems, pressure control subsystems, temperature control subsystems, electrical control subsystems, and mechanical control subsystems. Such control subsystems may receive various signals provided by sensors, relays, and controllers and make suitable adjustments in response.

System process controller 1422 comprises a computing system that includes a data-holding subsystem 1424 and a logic subsystem 1426. Data-holding subsystem 1424 may include one or more physical, non-transitory devices configured to hold data and/or instructions executable by logic subsystem 1426 to implement the methods and processes described herein. Logic subsystem 1426 may include one or more physical devices configured to execute one or more instructions stored in data-holding subsystem 1424. Logic subsystem 1426 may include one or more processors that are configured to execute software instructions.

In some embodiments, such instructions may control the execution of process recipes. Generally, a process recipe includes a sequential description of process parameters used to process a substrate, such parameters including, but not limited to, time, temperature, pressure, and concentration, as well as various parameters describing electrical, mechanical, and environmental aspects of the tool during substrate processing. The instructions may also control the execution of various maintenance recipes used during maintenance procedures.

In some embodiments, such instructions may be stored on removable computer-readable storage media 1428, which may be used to store and/or transfer data and/or instructions executable to implement the methods and processes described herein, excluding a signal per se. It will be appreciated that any suitable removable computer-readable storage media 1428 may be employed without departing from the scope of the present disclosure. Non-limiting examples include DVDs, CD-ROMs, floppy discs, and flash drives.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method of forming a tensile-stressed silicon arsenic layer, the method comprising the steps of:
   supporting a substrate comprising silicon in a reactor, wherein a surface of the substrate is exposed to a reaction region within the reactor;
   supplying a silicon source to the reactor;
   supplying an arsenic source to the reactor; and
   at a pressure between about 90 Torr and about 300 Torr, forming the tensile-stressed silicon arsenic layer having a concentration of arsenic of greater than 1 E+21 arsenic atoms/cubic centimeter on the surface.

2. The method of forming a tensile-stressed silicon arsenic layer of claim 1, wherein during the step of forming the tensile-stressed silicon arsenic layer, a temperature of the reaction region is between 500° C. and 700° C.

3. The method of forming a tensile-stressed silicon arsenic layer of claim 1, wherein during the step of forming the tensile-stressed silicon arsenic layer, a pressure within the reaction region is between 90 and 300 Torr.

4. The method of forming a tensile-stressed silicon arsenic layer of claim 1, wherein during the step of forming the tensile-stressed silicon arsenic layer, a carrier gas flow rate is between about 10 to about 40 standard liters per minute.

5. The method of forming a tensile-stressed silicon arsenic layer of claim 1, wherein during the step of supplying an arsenic source to the reactor, arsenic is provided in a non-reactive diluent.

6. The method of forming a tensile-stressed silicon arsenic layer of claim 1, wherein the step of forming the tensile-stressed silicon arsenic layer comprises epitaxially forming the tensile-stressed silicon arsenic layer on the silicon surface.

7. The method of forming a tensile-stressed silicon arsenic layer of claim 1, wherein the step of forming the tensile-stressed silicon arsenic layer comprises forming a layer comprising greater than or equal to 5 E+21 arsenic atoms/cubic centimeter.

8. The method of forming a tensile-stressed silicon arsenic layer of claim 1, further comprising forming a structure comprising the tensile-stressed silicon arsenic layer.

9. The method of forming a tensile-stressed silicon arsenic layer of claim 1, further comprising forming a device comprising the tensile-stressed silicon arsenic layer.

10. The method of claim 1, wherein the tensile-stressed silicon arsenic layer forms a channel region of a transistor device.

\* \* \* \* \*